(12) United States Patent
Oi et al.

(10) Patent No.: US 8,810,928 B2
(45) Date of Patent: Aug. 19, 2014

(54) COLLECTING LENS AND MULTI-SEGMENT LENS

(75) Inventors: Kana Oi, Osaka (JP); Takayuki Nishikawa, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/885,422

(22) PCT Filed: Feb. 29, 2012

(86) PCT No.: PCT/JP2012/055019
§ 371 (c)(1),
(2), (4) Date: May 15, 2013

(87) PCT Pub. No.: WO2012/118108
PCT Pub. Date: Sep. 7, 2012

(65) Prior Publication Data
US 2013/0235479 A1    Sep. 12, 2013

(30) Foreign Application Priority Data

Mar. 1, 2011 (JP) .................................. 2011-044237
Mar. 1, 2011 (JP) .................................. 2011-044238

(51) Int. Cl.
G02B 3/08 (2006.01)
H01L 31/0232 (2014.01)
G02B 19/00 (2006.01)
H01L 31/052 (2014.01)

(52) U.S. Cl.
CPC ............... *G02B 3/08* (2013.01); *H01L 31/0524* (2013.01); *H01L 31/02325* (2013.01); *G02B 19/0014* (2013.01); *G02B 19/009* (2013.01)
USPC .......................................... 359/742; 359/741

(58) Field of Classification Search
CPC ...... G02B 3/08; G02B 19/014; G02B 19/009; G02B 19/0076; H01L 31/0524; H01L 31/02325

USPC .................................................. 359/741, 742
See application file for complete search history.

(56) References Cited

U.S. PATENT DOCUMENTS 4,787,722 A    11/1988 Claytor
5,138,495 A     8/1992 Shiono et al.

FOREIGN PATENT DOCUMENTS

EP    2682789    * 1/2014
JP    62-134603    6/1987

(Continued)

OTHER PUBLICATIONS

English-language translation of the Preliminary International Report on Patentability (IB/373) prepared for PCT/JP2012/055019 (Sep. 3, 2013).*

(Continued)

*Primary Examiner* — David N Spector
(74) *Attorney, Agent, or Firm* — Greenblum & Bernstein P.L.C.

(57) ABSTRACT

A collecting lens comprises a first surface and a second surface. Said first surface lens is defined as an opposite surface of said collecting lens from said second surface. Said second surface has a lens surface. Said lens surface includes a plurality of lens function surfaces. Each of said lens function surfaces is defined as part of a side surface of corresponding one of elliptical cones. A particular normal line which is arbitrarily selected from normal lines at respective points on said first surface and crosses one of said lens function surface is not parallel to a central axis of the elliptical cone corresponding to said lens function surface crossed by said particular normal line. Said central axes of the elliptical cones are not parallel to each other.

7 Claims, 18 Drawing Sheets

(56) References Cited

FOREIGN PATENT DOCUMENTS

| | | |
|---|---|---|
| JP | 03-186801 | 8/1991 |
| JP | 04-084103 | 3/1992 |
| JP | 05-256695 | 10/1993 |
| JP | 07-036041 | 2/1995 |
| JP | 10-002791 | 1/1998 |
| JP | 3090336 | 9/2000 |
| JP | 3090337 | 9/2000 |
| JP | 2009-082958 | 4/2009 |

OTHER PUBLICATIONS

Kubota, "Kougaku", Iwanami Shoten Pub., vol. 12, Apr. 9, 1986, pp. 282-283 with English language translation.

International Search Report dated Mar. 27, 2012 with English language translation.

* cited by examiner

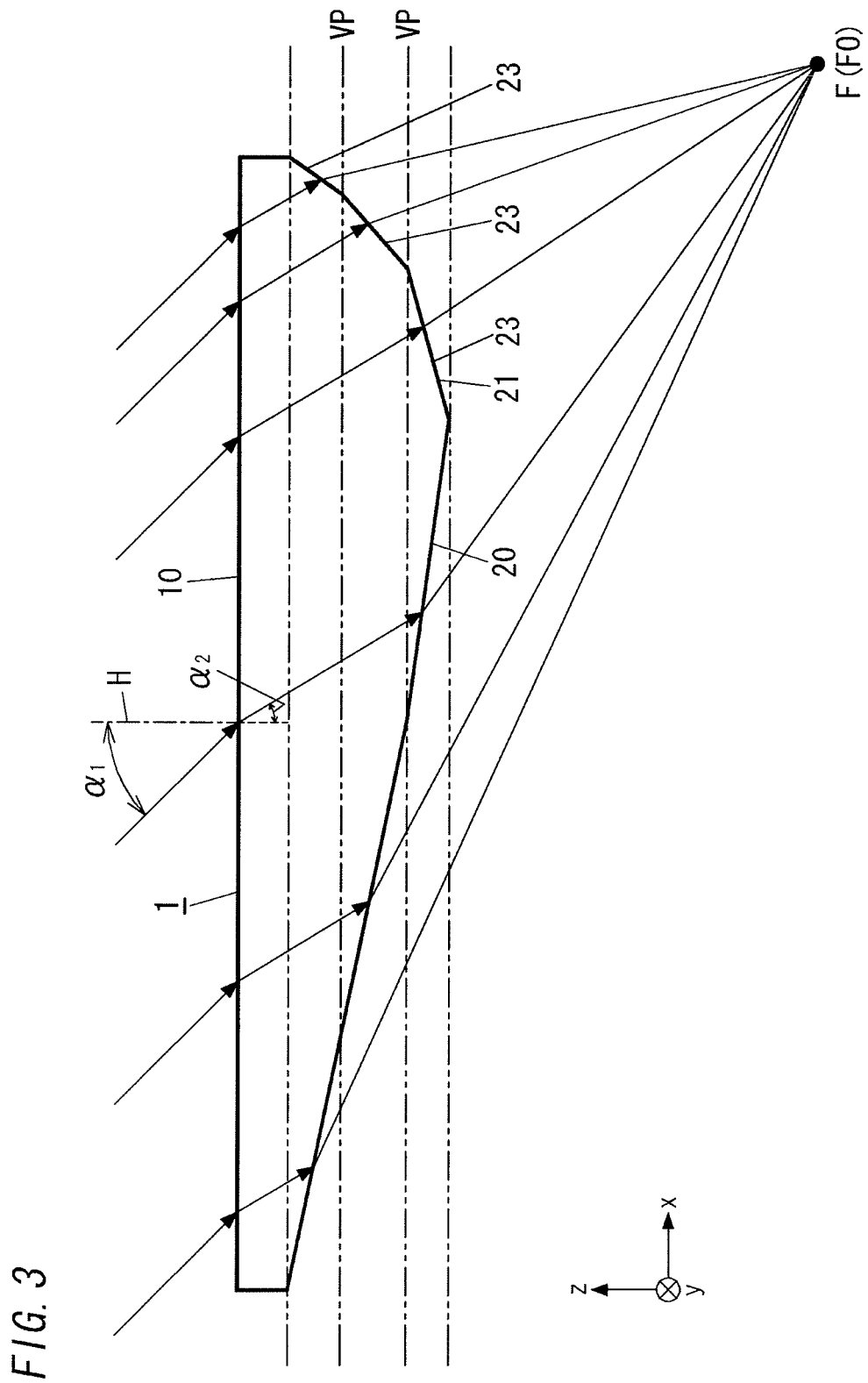

COLLECTING LENS AND MULTI-SEGMENT LENS

TECHNICAL FIELD

The present invention relates to a collecting lens and a multi-segment lens.

BACKGROUND ART

Conventionally, as shown in FIG. 15, a collecting lens 101 is known which has a flat surface 110 as a first surface and a hyperboloid surface 120 as a second surface, and in which the rotational axis C of the hyperboloid surface 120 is inclined so as to form an angle θ with the normal line H of the flat surface 110 (Japanese Examined Patent Application Publication No. H7-36041; called Patent Document 1). In a collecting lens 101 of the configuration shown in FIG. 15, light rays incident at a certain angle δ to the rotational axis C become parallel to the rotational axis C of the hyperboloid surface 120 within the collecting lens 101, and are focused aplanatically on a focal point F. The angle δ is an angle satisfying Snell's law, or in other words, $\sin(\theta+\delta) = n \sin\theta$ given n as the refractive index of the collecting lens 101. Thus, with the collecting lens 101 shown in FIG. 15, it is possible to suppress the occurrence of off-axis aberrations and collect light rays efficiently from directions oblique to the normal line H of the flat surface 110.

The collecting lens 101 disclosed in Patent Document 1 is designed for infrared light rays, and Patent Document 1 discloses using polyethylene as the lens material.

Patent Document 1 also describes a multi-segment lens with an array of a plurality of collecting lenses all having a focal point in the same position.

As shown in FIGS. 16A and 16B, moreover, Patent Document 1 also proposes making collecting lens 101 a Fresnel lens, and making the common rotational axis C of hyperboloid surfaces 121, 122 and 123 of the second surface intersect the flat surface 110 (the first surface) obliquely in order to suppress the occurrence of off-axis aberrations. In this case, hyperboloid surfaces 121, 122 and 123 constitute the lens surface.

In the collecting lens 101 of FIGS. 16A and 16B, Patent Document 1 describes the possibility of providing an angle between the normal line H of the flat surface 110 and parallel light rays that are focused aplanatically on a focal point, depending on the angle formed by the flat surface 110 and the common rotational axis C of hyperboloid surfaces 121, 122 and 123. It is thus possible to suppress the occurrence of off-axis aberrations and collect light rays efficiently from directions oblique to the normal line H of the flat plane 110 in the collecting lens 101 of FIGS. 16A and 16B.

Moreover, an axicon lens has been proposed whereby the focal depth can be increased over that of an axicon lens with a single conical surface (Japanese Unexamined Patent Application Publication No. 2009-082958; called Patent Document 2).

As shown in FIGS. 17A, 17B and 17C, Patent Document 2 describes preparing three lens members 221a, 221b and 221c with different conical surfaces as lens surfaces having different angles relative to a optical axis OX, and arranging the three lens members 221a, 221b and 221c in the light axial direction as shown in FIG. 17D to thereby obtain a greater focal depth than with an axicon lens having a single conical surface. Although the three lens members 221a, 221b and 221c are assembled to obtain an axicon lens having three conical surfaces in Patent Document 2, an axicon lens has also been proposed in which lens surface 213 is constituted with a spline curve (free curve) as shown in FIG. 17E. The focal depth can also be increased over that of an axicon lens having a single conical surface in an axicon lens constituted as shown in FIG. 17E.

Moreover, an optical sensing device has been proposed, provided with a multi-segment lens including a plurality of lenses with roughly the same focal position assembled on a single flat surface, together with an infrared sensing element that is a light-receiving element disposed at the aforementioned focal position (see for example Japanese Patent Publication No. 3090336 (called Patent Document 3) and Japanese Patent Publication No. 3090337 (called Patent Document 4)).

In the multi-segment lenses disclosed in Patent Documents 3 and 4, the first surface is a flat surface and the second surface is a hyperboloid surface having a main axis that intersects the normal line of the first surface obliquely. Moreover, the multi-segment lenses disclosed in Patent Documents 3 and 4 are designed for use with infrared light rays, and polyethylene is disclosed as the lens material. Moreover, Patent Documents 3 and 4 describe preparing the multi-segment lenses by injection molding.

In the collecting lens 101 of FIG. 15 disclosed in Patent Document 1, the rotational axis C of the hyperboloid surface 120 intersects the normal line H of the flat surface 110 obliquely, so hyperboloid surface 120 is not rotationally symmetrical relative to the normal line H of the flat surface 110. This makes the collecting lens 101 and the mold for the collecting lens 101 difficult to prepare by rotary forming using a lathe or the like.

In the collecting lens 101 of FIGS. 16A and 16B, moreover, the rotational axis C of the hyperboloid surfaces 121, 122 and 123, which constitute the output surface, is at an oblique angle to the normal line H of the flat surface 110, which is the input surface, so the hyperboloid surfaces 121, 122 and 123 are not rotationally symmetrical relative to the normal line H of the flat surface 110. This also makes the collecting lens 101 and the mold for the collecting lens 101 difficult to prepare by rotary forming using a lathe or the like.

Therefore, when preparing the collecting lenses 101 and molds for the collecting lenses 101 of FIG. 15 and FIGS. 16A and 16B above, the hyperboloid surfaces 120, 121, 122 and 123 or curved surfaces corresponding to these hyperboloid surfaces 120, 121, 122 and 123 must be formed using a fabricating machine with multiaxial control, by bringing only the cutting edge of a sharp cutting tool 130 with a nose radius (also called a corner radius) of a few microns into point contact with a work piece 140 and cutting it with a very fine pitch as shown in FIG. 18. The work piece 140 is a base material for forming the collecting lens 101 directly, or a base material for forming the mold. Consequently, the working time for preparing the collecting lens 101 or the mold for collecting lens 101 is prolonged, increasing the cost of the collecting lens 101.

Moreover, in the aforementioned multi-segment lenses the second surface of each lens is a hyperboloid surface intersecting the normal line of the first surface obliquely, and is not rotationally symmetrical relative to the normal line of the first surface, making the molds for the multi-segment lens difficult to prepare by rotary forming using a lathe or the like.

In addition, the axicon lens disclosed in Patent Document 2 cannot focus light rays incident from a direction oblique to the direction of lens thickness on a focal point. That is to say, the axicon lens disclosed in Patent Document 2 has a different purpose from one such as the collecting lens 101 disclosed in Patent Document 1, which focuses light rays incident at an angle to the first surface (flat surface 110) on a focal point F, or in other words from the collecting lens 101, in which the optical axis intersects the direction of lens thickness obliquely (at an angle).

DISCLOSURE OF THE INVENTION

It is an object of the present invention, which was developed in light of the reasons discussed above, to provide a collecting lens and multi-segment lens whereby the occurrence of off-axis aberrations can be suppressed when using incident light falling obliquely on a first surface from the outside, and whereby costs can be reduced.

The collecting lens of the present invention includes a first surface and a second surface. The first surface is defined as an opposite surface of the collecting lens from the second surface. The second surface has a lens surface. The lens surface includes a plurality of lens function surfaces. Each of the lens function surfaces is defined as part of a side surface of corresponding one of elliptical cones. A particular normal line is arbitrarily selected from normal lines at respective points on the first surface. The particular normal line crosses one of the lens function surfaces. The particular normal line is not parallel to a central axis of the elliptical cone corresponding to the lens function surface crossed by the particular normal line. The central axes of the elliptical cones are not parallel to each other.

In this collecting lens, it is desirable that an angle formed by the central axis and the particular normal line be greater in the elliptical cone corresponding to the lens function surface located further outside of the collecting lens.

This collecting lens is preferably defined as a Fresnel lens having a plurality of the lens surfaces.

This collecting lens preferably has a plurality of the lens surfaces, and a central lens surface located inward from the plurality of the lens surfaces. The central lens surface is defined as part of an aspheric surface of which curvature changes continuously. A specific normal line is selected arbitrarily from the normal lines at the respective points on the first surface. The specific normal line crosses the central lens surface corresponding to the aspheric surface. The specific normal line is not parallel to an axis of symmetry of the aspheric surface.

In this collecting lens, the aspheric surface is preferably a hyperboloid surface.

In this collecting lens, the collecting lens is preferably made of polyethylene, and the first surface is preferably a curved surface that is convex in the opposite direction from the second surface.

The multi-segment lens of the present invention is a multi-segment lens including a plurality of lenses assembled on a single surface, wherein each of the lenses is the aforementioned collecting lens.

BRIEF DESCRIPTION OF THE DRAWINGS

FIG. 3 is an explanatory drawing showing the advancing paths of the light rays incident on the collecting lens of Embodiment 1.

BEST MODE FOR CARRYING OUT THE INVENTION

Embodiment 1

Figure 1:
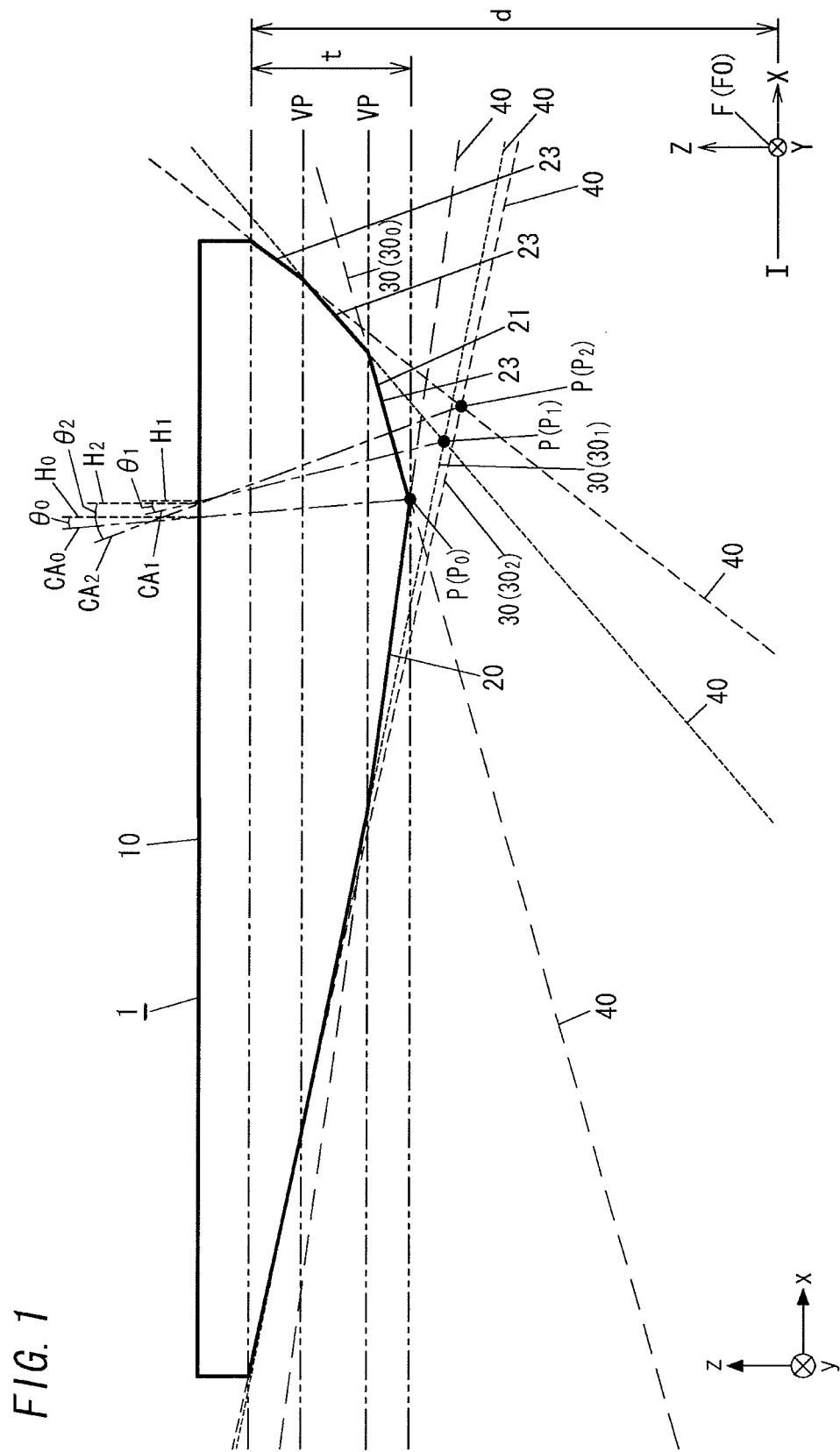
FIG. 1 is an explanatory drawing showing the geometric shape of the collecting lens of Embodiment 1.
Figure 2:
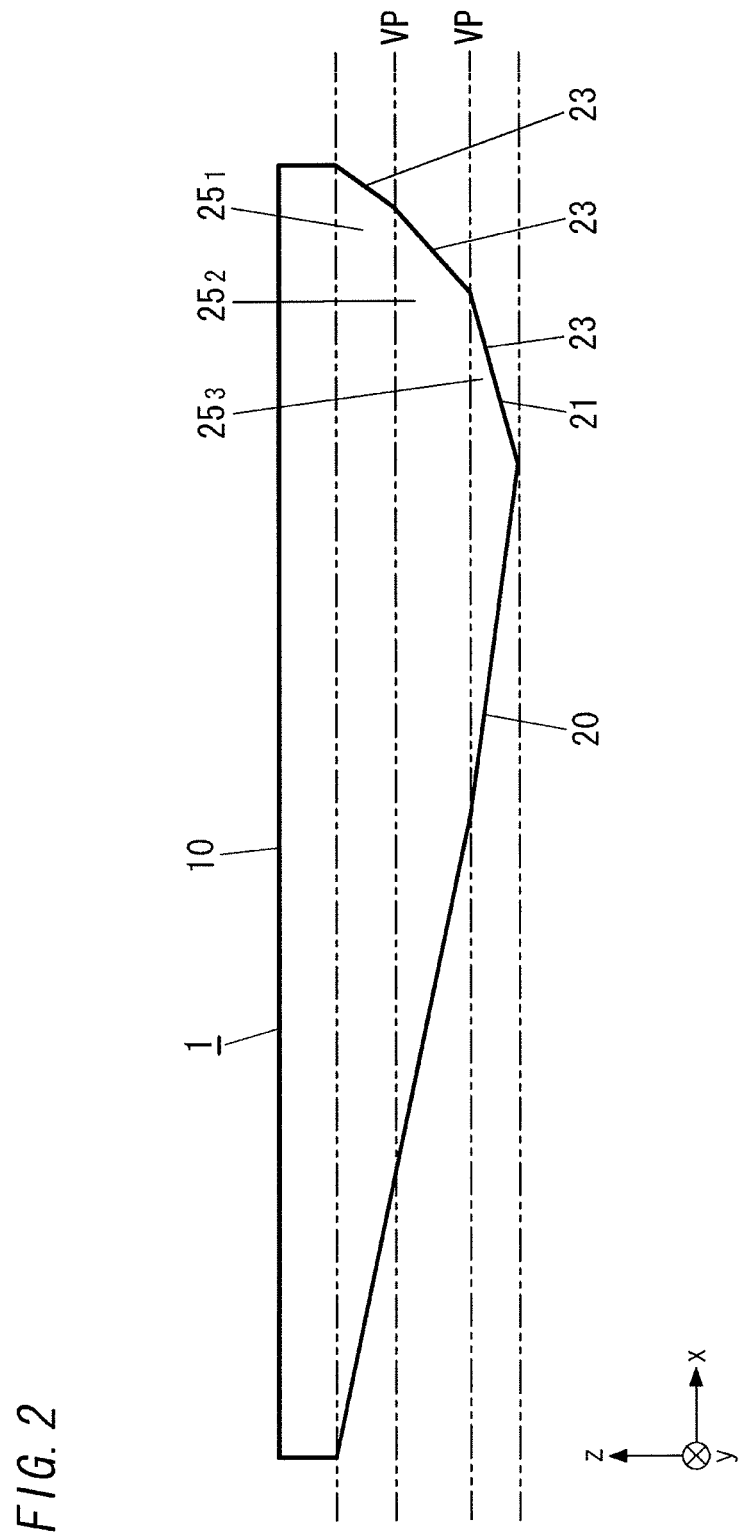
FIG. 2 is a cross-section of the collecting lens of Embodiment 1.

The collecting lens 1 of the present embodiment is explained below with reference to FIGS. 1 to 3.

The collecting lens 1 of the present embodiment has a lens surface 21 that is formed of a second surface 20 on the opposite side from a first surface 10. In the collecting lens 1, the optical axis (not shown) intersects the direction of lens thickness (vertical direction in FIG. 1) obliquely (at an angle).

Lens surface 21 is made up of a plurality of lens function surfaces (inclined surfaces) 23. This lens surface 21 is divided into lens function surfaces 23 bounded by virtual faces VP, which cross the direction of lens thickness, and forming different angles with the virtual faces VP. From a different perspective, as shown in FIG. 2, the second surface 20 side of the collecting lens 1 has a structure such as would be obtained by stacking layers $25_1$ and $25_2$ on either side of one virtual face VP in the direction of lens thickness, eliminating the boundary between layers $25_1$ and $25_2$, stacking layers $25_2$ and $25_3$ on either side of another virtual face VP, and eliminating the boundary between layers $25_2$ and $25_3$. Each virtual face VP here is defined as crossing the direction of lens thickness.

In the collecting lens 1, each lens function surface 23 is formed of part of the side surface of an elliptical cone 30, and out of the normal lines at the respective points on the first surface 10, a particular normal line crossing the lens function surface 23 formed of part of the side surface of the elliptical cone 30 is not parallel (is oblique) to the central axis of the elliptical cone 30 corresponding to the lens function surface 23 crossed by that particular normal line, and the mutual central axes of the elliptical cones are not parallel (are oblique). The apex of each elliptical cone 30 here is located on the second surface 20 side of the lens, while the base (not shown) is located on the first surface 10 side. Moreover, the central axis (not shown) of each elliptical cone 30 intersects a particular normal line at each point on the first surface 10 obliquely. When the direction connecting a point on the first surface 10 and the point where the particular normal line at that point crosses the lens function surface 23 is specified as the direction of lens thickness in the collecting lens 1, the direction along the particular normal line at each point on the first surface 10 is the direction of lens thickness if the first surface 10 is a flat surface. Because the first surface 10 is a flat surface in the collecting lens 1 of the present embodiment, the central axis of each elliptical cone 30 intersects the direction of lens thickness obliquely. Thus, in the collecting lens 1, each lens function surface 23 is formed of part of the side surface of an elliptical cone 30 of which apex is located on the second surface 20 side of the lens 1 and of which base (not shown) is located on the first surface 10 side of the collecting lens 1, and the central axis of which intersects the direction of lens thickness obliquely. The aforementioned virtual face VP is a plane containing the line of intersection between two elliptical cones 30 corresponding to two lens function surfaces 23 on either side of that virtual plane VP.

Moreover, an angle formed by the central axis and the particular normal line is greater in an elliptical cone 30 corresponding to a lens function surface 23 located further outside of the collecting lens 1.

In FIG. 3, the advancing paths of the light rays are shown with fine solid lines and arrows given the first surface 10 as the input surface and the second surface 20 as the output surface. In the collecting lens 1 of the present embodiment, as shown in FIG. 3, light rays incident on the first surface 10 from a direction that intersects the normal line of the first surface 10 of the collecting lens 1 obliquely (a direction that intersects the direction of lens thickness of the collecting lens 1 obliquely) are focused on a focal point F (F0) on the second surface 20 side of the collecting lens 1. Light rays incident on the first surface 10 at an incidence angle $\alpha_1$ are refracted at the first surface 10, and a refractive angle $\alpha_2$ can be determined by Snell's law. That is, given $n_1$ as the refractive index of the medium contacted by the first surface 10 and $n_2$ as the refractive index of the lens material, this becomes:

[Math. 1]

$$\frac{\sin\alpha_2}{\sin\alpha_1} = \frac{n_1}{n_2}$$

according to Snell's law. Thus, in one example of the collecting lens 1 of the present embodiment, given $n_1=1$ if the medium is air and $n_2=1.53$ if the lens material is polyethylene, then if $\alpha_1=45°$, $\alpha_2=27.5°$. In the collecting lens 1 of the present embodiment, parallel light that has been refracted at refractive angle $\alpha_2$ at the first surface 10 can be focused on focal point F by configuring each lens function surface 23 from part of the side surface of an elliptical cone 30. This point has been confirmed by simulation using a ray-tracing algorithm.

In the collecting lens 1 of the present embodiment, because the first surface 10 is a flat surface, each virtual face VP is a flat plane parallel to the first surface 10, and the central axes of the elliptical cones 30 intersect normal lines at each point on the first surface 10 obliquely. In a cross-sectional shape containing one virtual straight line extending in the direction of lens thickness (here, a cross-sectional shape containing a normal line H of the first surface 10), the angle formed by a lens function surface 23 and a plane parallel to the first surface 10 is an obtuse angle.

To resolve the issues of controlling off-axis aberrations and reducing costs, the inventors considered that in a basic structure in which a second surface 20 is composed of parts of a plurality of hyperboloid surfaces (each being one sheet of a hyperboloid of two sheets) the main axes of which intersect the normal line of a first surface 10 obliquely, these parts of the plurality of hyperboloid surfaces could be approximated by straight lines in a cross-sectional shape containing one virtual straight line extending in the direction of lens thickness.

In a hyperboloid surface, a collection of tangent lines at each point on a cross-section bisecting the rotational axis of that hyperboloid surface at right angles is a circular cone. Thus, in a collecting lens in which the shape of each lens function surface on the output surface is rotationally symmetrical around a normal line of the input surface as a rotational axis, each lens function surface can be approximated as part of the side surface of a cone.

In an orthogonal coordinate system with the center of an arbitrary flat plane as an origin and the x axis and the y axis defined as crossing each other at right angles on this arbitrary flat plane, while the z axis is perpendicular to the arbitrary flat plane, the equation of the cone is represented by the following canonical form with (x, y, z) being the coordinates of arbitrary points on the cone, and b and c being the coefficients.

[Math. 2]

$$\frac{x^2 + y^2}{b^2} - \frac{z^2}{c^2} = 0 \; (b, c > 0)$$

In a cone represented by this canonical form, the line of intersection with a plane parallel to the xy flat plane is a circle.

Thus, in a frustum of a cone obtained by cutting this cone on two planes parallel to the xy flat plane, it is not possible to approximate the aforementioned part of the hyperboloid surface in the canonical structure discussed above.

Focusing on the fact that in the basic structure described above the line of intersection between a hyperboloid surface and a flat plane intersecting the main axis of the hyperboloid surface obliquely is an ellipse, the inventors conceived of constituting each of the plurality of lens function surfaces 23 in a lens surface 21 as part of the side surface of an elliptical cone 30 of which apex P is located on the second surface 20 side of the lens and of which base (not shown) is located on the first surface 10 side, and the central axis of which intersects the direction of lens thickness obliquely.

Each lens function surface 23 is a continuous surface formed by a collection (line group) of straight lines 40 (shown as broken lines in FIG. 1), and the single point at which all the straight lines 40 making up the line group intersect is the apex P of the aforementioned elliptical cone 30. Thus, if the layers $25_1$, $25_2$ and $25_3$ are very thin, part of the hyperboloid surface can be approximated by part of the side surface of the elliptical cone 30, and in a cross-sectional shape containing one virtual straight line extending in the direction of lens thickness, this same part of the hyperboloid surface can be approximated by a straight line. In FIG. 1, the apex P of the elliptical cone 30 corresponding to the lens function surface 23 below the lower of two virtual faces VP is called $P_0$. Moreover, in FIG. 1 the apex P of the elliptical cone 30 corresponding to the lens function surface 23 above the lower virtual face VP is called $P_1$. Finally, in FIG. 1 the apex P of the elliptical cone 30 corresponding to the lens function surface 23 above the upper virtual face VP is called $P_2$.

In an orthogonal coordinate system with the center of an arbitrary flat plane as an origin and the x axis and the y axis defined as bisecting each other at right angles on this arbitrary flat plane, while the z axis is perpendicular to the arbitrary flat plane, the equation of the elliptical cone is expressed in the following canonical form with (x, y, z) being the coordinates of arbitrary points on the elliptical cone, and a, b and c being the coefficients.

[Math. 3]

$$\frac{x^2}{a^2} + \frac{y^2}{b^2} - \frac{z^2}{c^2} = 0 \quad (a \neq b \text{ and } a, b, c > 0)$$

In an elliptical cone represented by this canonical form, the line of intersection with a plane parallel to the xy flat plane is an ellipse. An elliptical cone 30 that intersects the direction of lens thickness obliquely can be represented by this canonical form by performing an appropriate coordinate conversion on an orthogonal coordinate system with the x axis and the y axis specified within a plane perpendicular to the direction of lens thickness (here, within a plane parallel to the first surface 10) and the z axis specified in the direction of lens thickness as in the orthogonal coordinate system shown in the lower left of FIGS. 1 to 3, to thereby designate a new orthogonal coordinate system.

In the explanations below, different symbols are assigned to the three different elliptical cones 30 in the collecting lens 1 of FIG. 1 for purposes of convenience. The elliptical cone 30 corresponding to the central lens function surface 23 is called elliptical cone $30_0$, the one corresponding to the lens function surface 23 closest to the central lens function surface 23 is called elliptical cone $30_1$, and the one corresponding to a lens function surface 23 second-closest to the central lens function surface 23 is called elliptical cone $30_2$. That is, of the elliptical cones 30 other than the elliptical cone $30_0$ corresponding to the central lens function surface 23, the one corresponding to the nth (n≥1) lens function surface 23 from central lens function surface 23 is called elliptical cone $30_n$. The apices P, P, P of the elliptical cones $30_0$, $30_1$ and $30_2$ are called apices $P_0$, $P_1$ and $P_2$, respectively, and the central axes of the respective elliptical cones $30_0$, $30_1$ and $30_2$ are called $CA_0$, $CA_1$ and $CA_2$. Thus, the apex of the elliptical cone $30_n$ corresponding to the nth (n≥1) lens function surface 23 from the central lens function surface 23 is called $P_n$, and the central axis of this elliptical cone $30_n$ is called $CA_n$. Orthogonal coordinate systems are then defined for elliptical cones $30_0$, $30_1$ and $30_2$ with apex $P_0$, $P_1$ or $P_2$ as the origin and central axis $CA_0$, $CA_1$ or $CA_2$ as the z axis, and with the x axis extending in the major axial direction and the y axis in the minor axial direction of the ellipse in a cross-section perpendicular to the z axis. The formulas for elliptical cones $30_0$, $30_1$ and $30_2$ can then be expressed by the equation (canonical form) given above for an elliptical cone in each orthogonal coordinate system.

A lens having three lens function surfaces 23 each formed of part of the side surface of an elliptical cone 30 is given as a collecting lens 1 of one example. In the collecting lens 1 of this example, of the three elliptical cones 30, the one corresponding to the central lens function surface 23 is called elliptical cone $30_0$, the one corresponding to the lens function surface 23 on the outside of this surface is called elliptical cone $30_1$, and the one corresponding to the lens function surface 23 further outside from this surface is called elliptical cone $30_2$. In the collecting lens 1 of this example, given 3 mm as the maximum difference t (see FIG. 1) of the second surface 20 and polyethylene with a refractive index of 1.53 as the lens material, the coefficients a, b and c in the equation (canonical form) of the aforementioned elliptical cone have the values shown in Table 1. However, the prior conditions for determining the values for the coefficients a, b and c shown in Table 1 are that the incident light rays are focused on the focal point F at an incident angle of 45°, with 10 mm as the distance d (see FIG. 1) from an image plane I parallel to the first surface 10 of the collecting lens 1 to a reference plane parallel to the first surface 10 (in this case, a plane parallel to the first surface 10 and containing a point separated by only the aforementioned maximum distance t on the first surface 10 side in the direction of lens thickness from the position of the apex $P_0$). The relative positional relationships of apices $P_0$, $P_1$ and $P_2$ can be expressed for example in terms of the coordinates (X, Y and Z) of apices $P_0$, $P_1$ and $P_2$ using an orthogonal coordinate system having the focal point F of the collecting lens 1 as the origin, with the x axis and the y axis bisecting each other at right angles on the image plane I containing the focal point F, and the Z axis specified in the direction perpendicular to the image plane I. In this example $P_0$=(−6.78, 0, 7.00), $P_1$=(−5.63, 0, 6.40), $P_2$=(−4.97, 0, 6.05).

TABLE 1

| Lens function surface | Coefficient a | Coefficient b | Coefficient c |
| --- | --- | --- | --- |
| Elliptical cone $30_0$ | 0.16 | 0.12 | 0.03 |
| Elliptical cone $30_1$ | 6.26 | 5.42 | 3.04 |
| Elliptical cone $30_2$ | 5.19 | 4.76 | 3.22 |

Moreover, in the collecting lens 1 of this example, given $\theta_0$ as the angle formed by the central axis $CA_0$ of the elliptical cone $30_0$ and the particular normal line $H_0$ of the first surface 10 at the point where the central axis $CA_0$ crosses the first surface 10 with the apex $P_0$ as the origin, $\theta_1$ as the angle formed by the central axis $CA_1$ of the elliptical cone $30_1$ and the particular normal line $H_1$ of the first surface 10 at the point where the central axis $CA_1$ crosses the first surface 10 with apex $P_1$ as the origin, and $\theta_2$ as the angle formed by the central axis $CA_2$ of the elliptical cone $30_2$ and the particular normal line $H_2$ of the first surface 10 at the point where the central axis $CA_2$ crosses the first surface 10 with apex $P_2$ as the origin, angles $\theta_0$ to $\theta_2$ have the values shown in Table 2 below.

TABLE 2

| | |
| --- | --- |
| $\theta_0$ | 4.08° |
| $\theta_1$ | 14.58° |
| $\theta_2$ | 19.62° |

It can be seen from Table 2 that in the collecting lens 1, the particular normal line of the first surface 10 crossing a lens function surface 23 is not parallel to the central axis of the elliptical cone 30 corresponding to the lens function surface 23, and that the central axes of the elliptical cones $30_0$, $30_1$ and $30_2$ are not mutually parallel.

Moreover, it can be seen from Table 2 that in the collecting lens 1, the angle formed by the central axis and the particular normal line is greater in the elliptical cone 30 corresponding to the lens function surface 23 located further outside of the collecting lens 1.

In the collecting lens 1 of the present embodiment, the respective shapes of the plurality of lens function surfaces 23 in the lens surface 21 are described with straight lines in a cross-section containing one virtual straight line extending in the direction of lens thickness. Thus, with the collecting lens 1 of the present embodiment, the lens surface 21 or a curved surface corresponding to the lens surface 21 can be formed by angling the cutting tool relative to the work piece (a base material for forming the collecting lens 1 directly, or a base material for forming the mold), and bringing the side surface of the blade into line contact to cut the work piece. As a result, with the collecting lens 1 of the present embodiment it is possible to reduce the time taken to work the work piece with the cutting tool when manufacturing the collecting lens 1 or a mold for the collecting lens 1. The lens material of the collecting lens 1 can be selected appropriately according to the wavelength of the light rays, and can be selected appropriately from plastics (polyethylene, acrylic resin, etc.), glass, silicon, germanium and the like for example. When the wavelength of the light rays is in the infrared range for example, polyethylene, silicon, germanium or the like may be selected, while when the wavelength of the light rays is in the visible range, acrylic resin, glass or the like may be selected. The material of the mold is not particularly limited, but phosphor bronze or the like may be used for example. When a mold is used to form the collecting lens 1, the lens can be molded by injection molding, compression molding or the like for example.

The collecting lens 1 of the present embodiment as explained above includes the first surface 10 and the second surface 20. The first surface 10 is defined as an opposite surface of the collecting lens 1 from the second surface 20. The second surface has one lens surface 21. The lens surface 21 includes a plurality of the lens function surfaces 23. Each of the lens function surfaces 23 is defined as part of a side surface of corresponding one of the elliptical cones 30. A particular normal line is arbitrarily from the normal lines at respective points on the first surface 10. The particular normal line crosses one of the lens function surfaces 23. The particular normal line is not parallel to the central axis of the elliptical cone 30 corresponding to the lens function surface 23 crossed by the particular normal line. The central axes of the elliptical cones 30 are parallel to each other. It is thus possible to suppress the occurrence of off-axis aberrations when using incident light falling obliquely on the first surface 10 from the outside, and to reduce costs in the collecting lens 1 of the present embodiment. In the collecting lens 1, the angle formed by the central axis and the particular normal line is preferably greater in the elliptical cone 30 corresponding to the lens function surface 23 located further outside of the lens. With this configuration, it is possible to more suppress the occurrence of off-axis aberrations, and reduce costs.

To explain further, in the collecting lens 1 of the present embodiment the lens surface 21 is divided into lens function surfaces 23 bounded by virtual faces VP. Virtual faces VP cross the direction of lens thickness. Each of the lens function surfaces 23 forms different angles with the virtual planes VP. In the collecting lens 1 of the present embodiment, moreover, each lens function surface 23 is formed of part of the side surface of an elliptical cone 30 that has its apex P located on the second surface 20 side of the collecting lens 1 and its base located on the first surface 10 side of the collecting lens 1. And the central axis of the elliptical cone 30 intersects the direction of lens thickness obliquely. Thus, the optical axis intersects the direction of lens thickness obliquely in the collecting lens 1 of the present embodiment. Moreover, with the collecting lens 1 of the present embodiment it is possible to suppress the occurrence of off-axis aberrations, and reduce costs. In particular, in the collecting lens 1 of the present embodiment it is possible to greatly reduce the time taken to work the work piece (a base material for forming the collecting lens 1 directly or a base material for forming the mold) when forming a large-aperture collecting lens 1, thereby contributing to lower costs.

Moreover, each virtual face VP is specified as crossing the direction of lens thickness in the collecting lens 1 of the present embodiment, making it easier to design each lens function surface 23, and easier to adjust the height of the cutting tool when cutting the lens as discussed above. Moreover, when testing the precision of lens shape in the collecting lens 1 of the present embodiment, testing can be accomplished easily by measuring the angle of each lens function surface 23, contributing to lower manufacturing costs. The number of virtual faces VP is not limited to two, and one face or three or more faces are possible. Thus, the number of virtual faces VP may be single or plural.

Embodiment 2

Figure 4A:
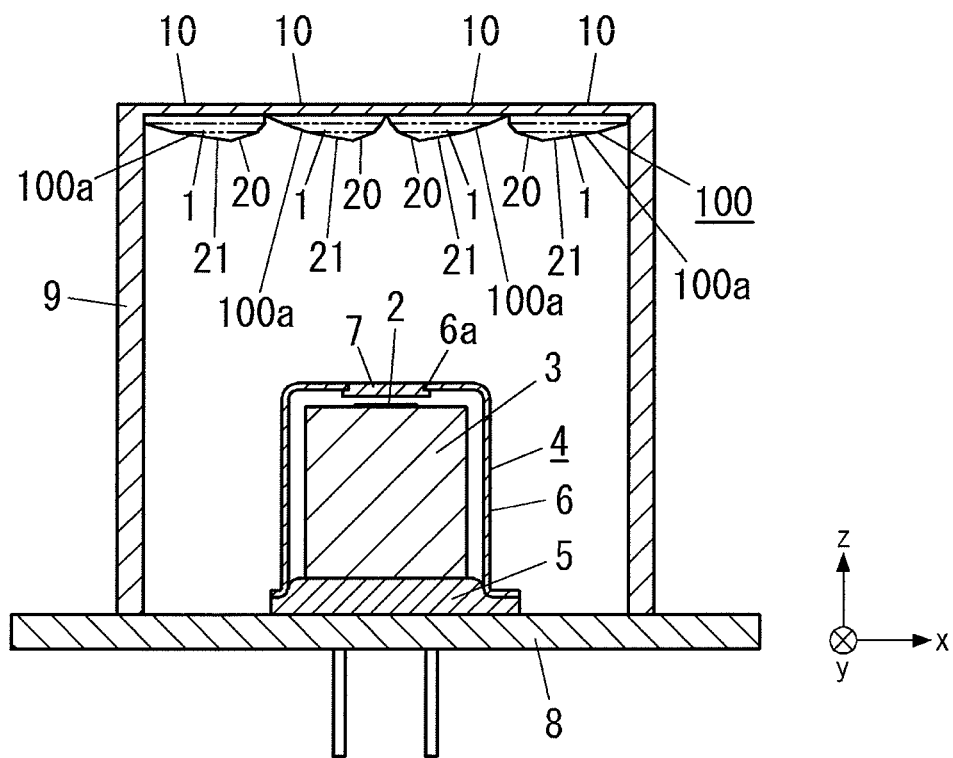
FIG. 4A is a rough cross-section illustrating an applied example of the multi-segment lens of Embodiment 2.
Figure 4B:
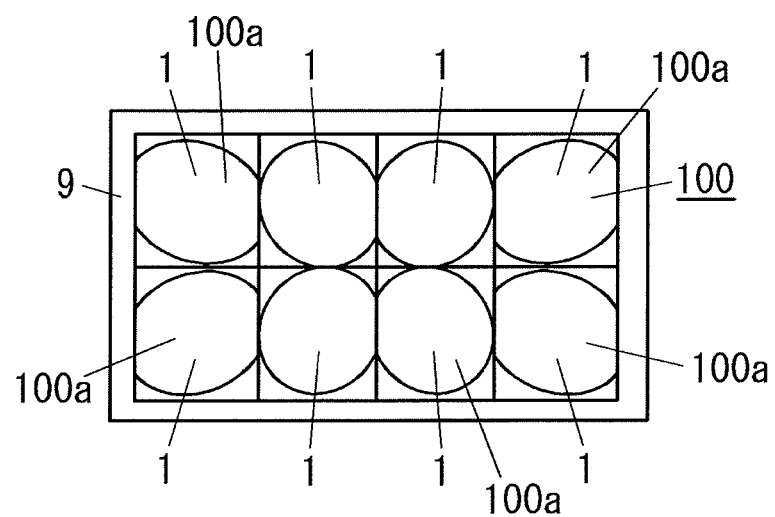
FIG. 4B is a rough bottom view of the essential parts of an applied example of the multi-segment lens of Embodiment 2.

In the present embodiment, a sensor apparatus of the configuration shown in FIGS. 4A and 4B is used as an applied example of a multi-segment lens.

This sensor apparatus includes package 4 mounted on a circuit board 8, which is a printed wiring board. This package 4 is made up of a disk-shaped stem 5, a bottomed cylindrical cap 6, which is bonded to this stem 5, and a light-transmitting member 7, which is disposed so as to block an aperture 6a formed at the bottom of the cap 6, and functions to transmit the desired light rays. The package 4 also contains an element-holding member (a MID substrate or the like for example) 3 for holding a photoelectric conversion element 2. In the sensor apparatus, a cover member 9 having a multi-segment lens 100 is disposed on one side of the circuit board 8 so as to cover package 4. A pyroelectric element or other infrared sensor element or a photodiode or other light-receiving element or the like for example can be used as the photoelectric conversion element 2 here. When an infrared sensor element is used as the photoelectric conversion element 2, a silicon substrate, germanium substrate or the like is preferably used as the light-transmitting member 7. In this case, moreover, both the stem 5 and cap 6 of the package 4 are preferably formed of a metal material, and the light-transmitting member 7 and cap 6 are preferably bonded by an electrically conductive material. In addition, in this case the air layer, in the space between the cover member 9 and the package 4 in the sensor apparatus, functions as a heat-insulating layer.

The multi-segment lens 100 includes a plurality of lenses 100a assembled on a single surface (a single flat surface in the example shown), and each lens 100a is the collecting lens 1 explained in Embodiment 1. However, each collecting lens 1 is designed so that the optical axis of each (not shown) passes through a specific light-receiving surface of the photoelectric conversion element 2.

Thus, with the multi-segment lens 100 of the present embodiment it is possible to control the occurrence of off-axis aberrations when using incident light falling obliquely on the first surface 10 of each collecting lens 1 from the outside, and also to reduce costs.

In other words, in the multi-segment lens 100 of the present embodiment it is possible to control the occurrence of off-axis aberrations and reduce costs with the optical axis intersecting the direction of lens thickness obliquely. Moreover, when an infrared sensor element for example is used as the photoelectric conversion element 2 in the sensor apparatus, it is possible to achieve an infrared sensor with a wide detection area as the sensor apparatus.

A quad-type pyroelectric element including four elements (light-receiving parts) formed on a single pyroelectric substrate for example can be used as the pyroelectric infrared detecting element making up the aforementioned infrared sensor element. The detection area of the sensor apparatus is determined by the infrared sensor element and by the multi-segment lens 100. Thus, detection beams in the same number as the number of elements are set for each collecting lens 1 in the detection area of the sensor apparatus. A detection beam (also called a detection zone) is a small range near the peak of the amount of infrared rays incident on the infrared sensor element, which is the effective area for detecting infrared rays from a physical object of detection. In the sensor apparatus shown in FIGS. 4A and 4B, because multi-segment lens 100 is composed of eight collecting lenses 1, 8×4 detection beams are set within the detection area. The number of collecting lenses 1 in the multi-segment lens 100 is not particularly limited. Moreover, the pyroelectric infrared detecting element need not be a quad-type pyroelectric element, and for example it is also possible to use a dual-type pyroelectric element including two elements (light-receiving parts) formed on a single pyroelectric substrate.

Embodiment 3

The collecting lens 1 of the present embodiment is explained below with reference to FIG. 5.

The basic configuration of the collecting lens 1 of the present embodiment is roughly the same as in Embodiment 1. The collecting lens 1 of the present embodiment differs from Embodiment 1 in the shape of the first surface 10. Constituent elements that are the same as in Embodiment 1 are assigned the same symbols, and explanations thereof are omitted.

In the collecting lenses 1 of Embodiments 1 and 2, using polyethylene as the lens material, even with a lens thickness of 1 mm, the transmittance of infrared rays near a wavelength of 10 microns perpendicularly incident on the first surface 10 is 40%, and the transmittance declines as the lens thickness increases. In the case of incident light oblique to the direction of lens thickness of the collecting lens 1, moreover, the transmittance may be excessively low because the optical path becomes even longer than the maximum lens thickness of the collecting lens 1. Moreover, in a collecting lens 1 formed of polyethylene, if there are large changes in lens thickness there is a risk of sink marks due to uneven shrinkage and the like during the cooling and solidification processes of injection molding, potentially detracting from external appearance.

Thus, the collecting lens 1 is manufactured by injection molding. And the first surface 10 in the collecting lens 1 made of polyethylene is preferably made as a curved surface that is convex in the opposite direction from the second surface 20 as shown in FIG. 5 for example. In this case, the direction of lens thickness is the normal direction at each point on the first surface 10. With the collecting lens 1 of the present embodiment, it is possible to restrict the direction of swelling to one direction and prevent problems of external appearance by making the first surface 10 be a curved surface that is convex in the opposite direction from the second surface 20.

Figure 5:
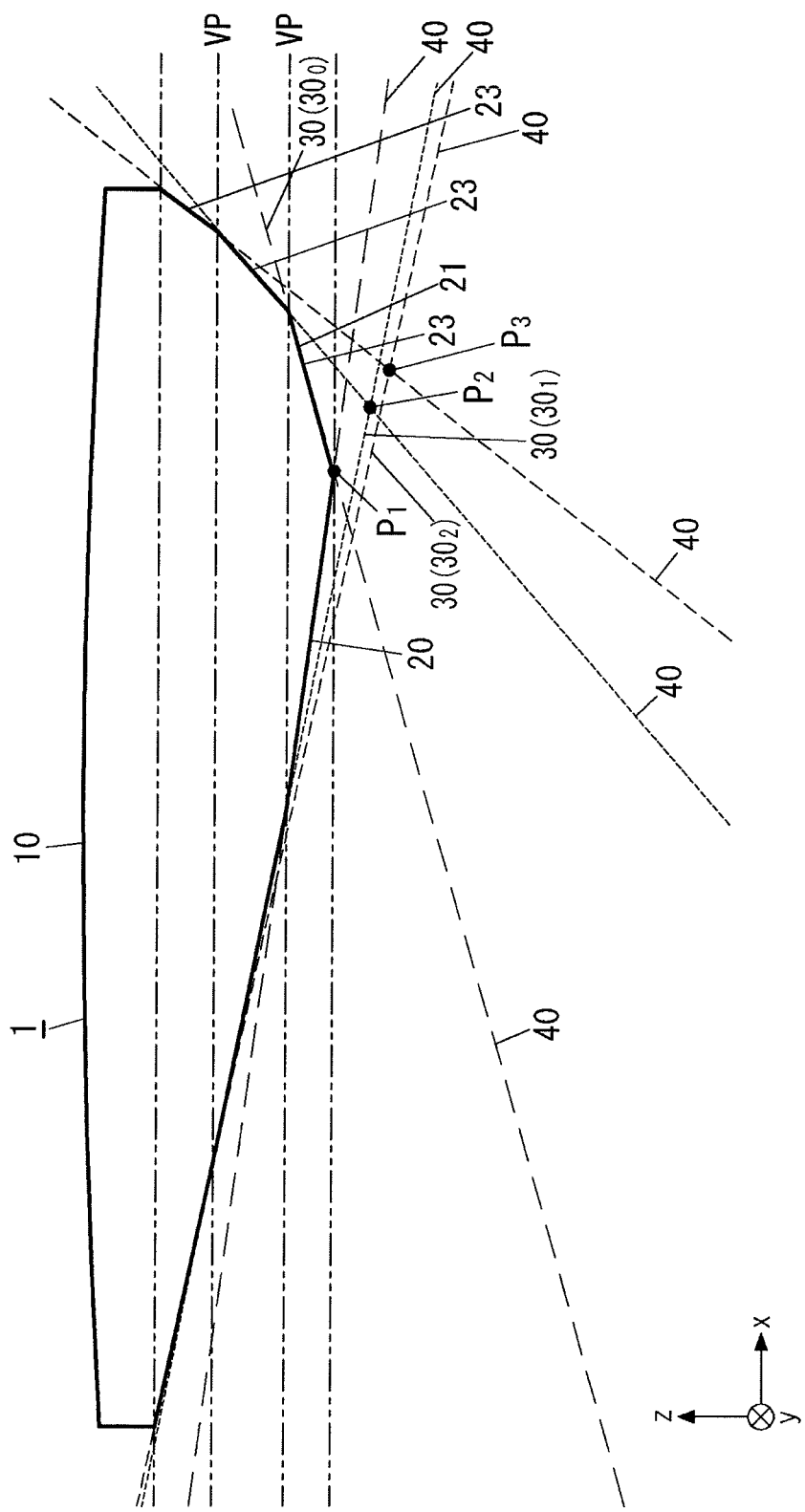
FIG. 5 is an explanatory drawing showing the geometric shape of the collecting lens of Embodiment 3.

In the example shown in FIG. 5, the first surface 10 is formed of part of a sphere with a large curvature radius (a curved surface with a small curvature), but it need not be part of a sphere. A "large curvature radius" here means a curvature radius that is large enough for the first surface 10 to appear as a flat surface, but the curvature radius of the first surface 10 may be designed appropriately based on the lens radius of the collecting lens 1 and the like.

That is, if the curvature of the first surface 10 is designed within a range at which off-axis aberrations do not exceed an allowable value (for example, no more than the size of photoelectric conversion element 2 above) in the collecting lens 1 made of polyethylene, it is possible to both suppress off-axial aberrations and control the occurrence of sink marks and swelling even while reducing the lens thickness. In this Description, forms including a first surface 10 having such a curvature and a first surface 10 consisting of a flat surface 10 are called flat first surfaces 10. Even a first surface in a collecting lens 1 explained with reference to FIGS. 4A and 4B preferably has a curved surface that is convex in the opposite direction from the second surface 20.

Embodiment 4

The collecting lens 1 of the present embodiment is explained below with reference to FIGS. 6 to 8. Constituent elements that are the same as in Embodiment 1 are assigned the same symbols, and explanations thereof are omitted as necessary.

Among other things, the collecting lens 1 of the present embodiment differs from that of Embodiment 1 in that the second surface 20 has a plurality of (three in the figure) lens surfaces 21. The second surface 20 is on the opposite side from the first surface 10. As in Embodiment 1, the optical axis (not shown) of collecting lens 1 of the present embodiment intersects the direction of lens thickness (vertical direction in FIG. 6) obliquely (at an angle). This collecting lens 1 defined as Fresnel lens 1 has central lens part 1a and a plurality of (two in the example shown) ring-shaped lens parts 1b surrounding the central lens part 1a. The number of ring-shaped lens parts 1b is not particularly limited, and may be three or more.

Figure 7:
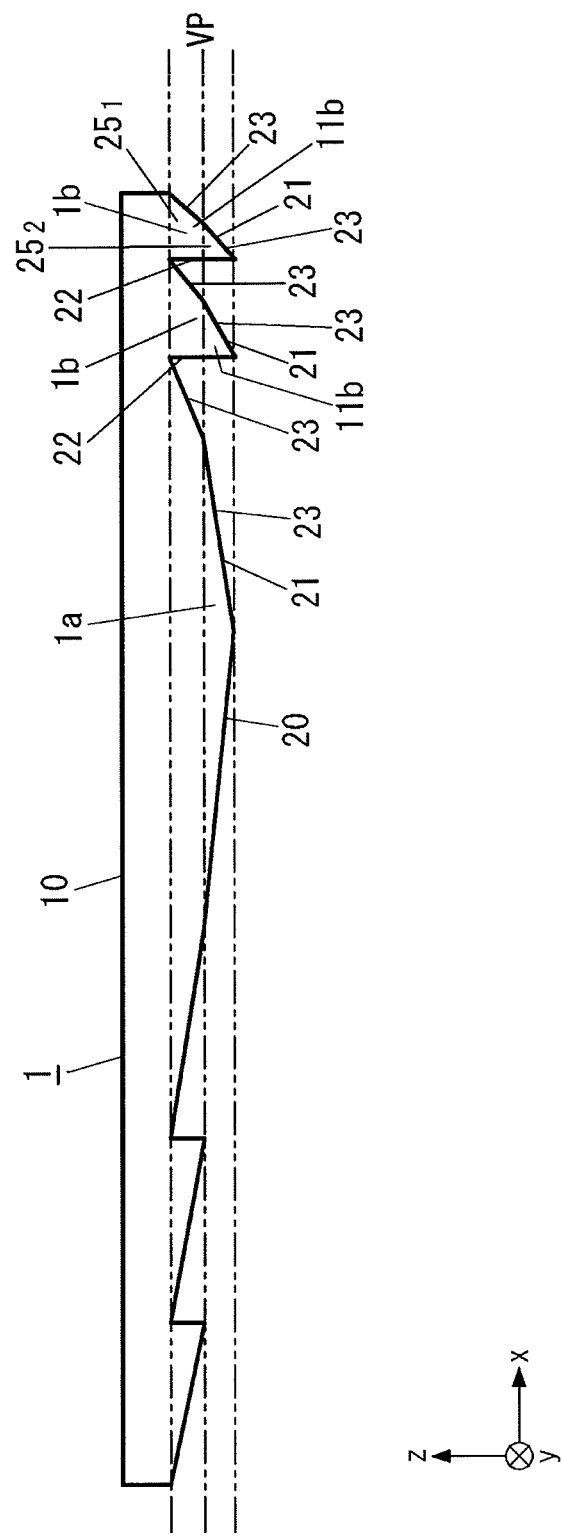
FIG. 7 is a cross-section of the collecting lens of Embodiment 4.

Each ring-shaped lens part 1b has a peak 11b on the second surface 20 side of the lens 1 (see FIG. 7). The peak 11b has a rising surface (non-lens surface) 22, which is the side surface facing the central lens part 1a, and a lens surface 21, which is the side surface on the opposite side from the central lens part 1a. Thus, the second surface 20 of the Fresnel lens 1 has a lens surface 21 on each ring-shaped lens part 1b. Moreover, the second surface 20 of the Fresnel lens 1 has a lens surface 21 on the central lens part 1a.

That is, the collecting lens 1 of the present embodiment has a plurality of lens surfaces 21. The collecting lens 1 of the present embodiment has a central lens part 1a having an innermost lens surface 21 of the plurality of lens surfaces 21, and a plurality of ring-shaped lens parts 1b surrounding the central lens part 1a. The collecting lens 1 is a Fresnel lens (which can be made thinner than a convex lens), and the lens surface 21 of the central lens part 1a is a convex surface in the opposite direction from the first surface 10.

Each lens surface 21 is formed of a plurality of lens function surfaces 23. Each lens surface 21 is divided into lens function surfaces 23 bounded by virtual faces VP crossing the direction of lens thickness, and each lens surface 21 is forming a different angle with virtual faces VP. From a different perspective, as shown in FIG. 7, the second surface 20 side of the collecting lens 1 has a structure such as would be obtained by stacking layers $25_1$ and $25_2$ on either side of a virtual face VP in the direction of lens thickness, and eliminating the boundary between layers $25_1$ and $25_2$.

Figure 6:
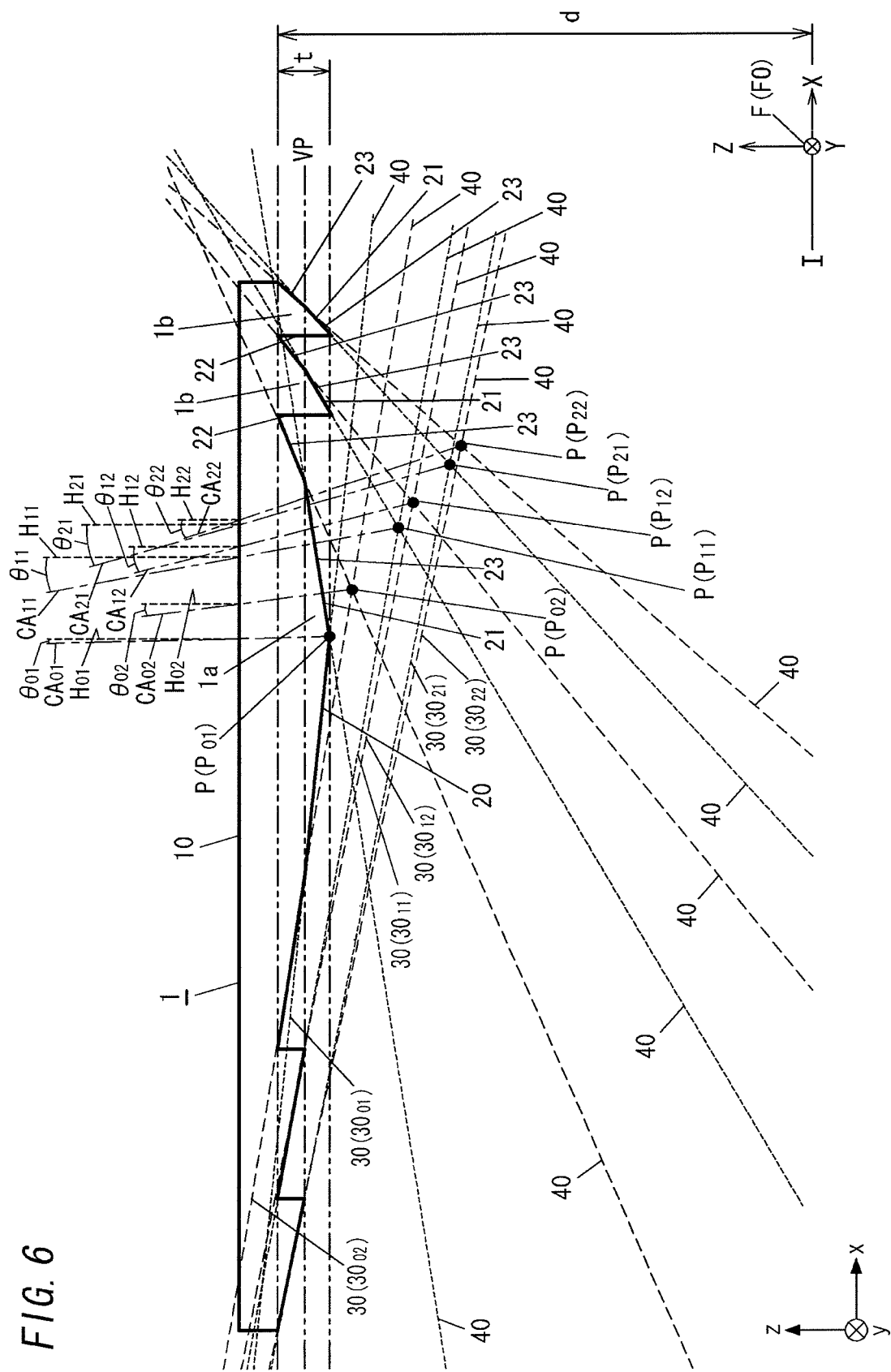
FIG. 6 is an explanatory drawing showing the geometric shape of the collecting lens of Embodiment 4.

In the collecting lens 1, each lens function surface 23 is defined as part of the side surface of corresponding one of elliptical cones 30 (see FIG. 6). A particular normal line is selected from the normal lines at the respective points on the first surface 10. The particular normal line crosses one of the lens function surfaces 23 is not parallel (is oblique) to the central axis of the elliptical cone 30 corresponding to the lens function surface 23 crossed by that arbitrary normal line. The mutual central axes of the elliptical cones 30 are not in parallel (are oblique). The apex of each elliptical cone 30 here is located on the second surface 20 side of the lens, and its base (not shown) is located on the first surface 10 side. Moreover, the central axis of each elliptical cone 30 intersects the normal line at each point of the first surface 10 obliquely. When the direction connecting a point on the first surface 10 and the point where the normal line at that point crosses lens function surface 23 is defined as the direction of lens thickness in the collecting lens 1, the direction along the normal line at each point on the first surface 10 is the direction of lens thickness if the first surface 10 is a flat surface. Because the first surface 10 is a flat surface in the collecting lens 1 of the present embodiment, the central axis of each elliptical cone 30 intersects the direction of lens thickness obliquely. Thus, in the collecting lens 1 each lens function surface 23 is formed of part of the side surface of an elliptical cone 30 of which apex located on the second surface 20 side of the lens and of which base (not shown) is located on the first surface 10 side, and the central axis of which intersects the direction of lens thickness obliquely.

Moreover, in the collecting lens 1 the angle formed by the central axis and the particular normal line is greater in the elliptical cone 30 corresponding to the lens function surface 23 located further outside of the lens. A virtual face VP is defined as crossing the direction of lens thickness. The aforementioned virtual face VP is a plane containing the line of intersection between two elliptical cones 30 corresponding to two lens function surfaces 23 on either side of that virtual face VP.

Figure 8:
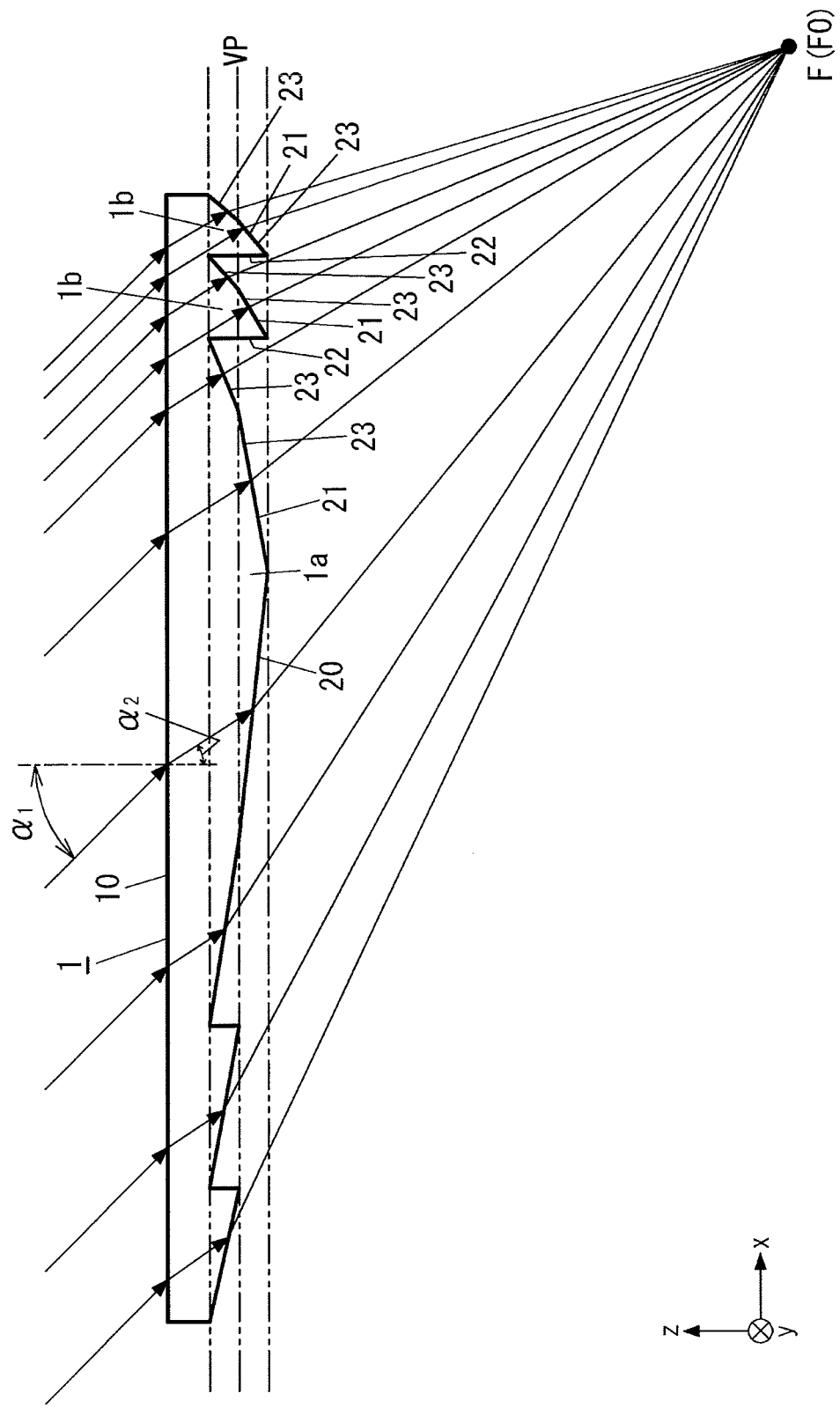
FIG. 8 is an explanatory drawing showing the advancing paths of the light rays incident on the collecting lens of Embodiment 4.

In FIG. 8, given the first surface 10 as the input surface and the second surface 20 as the output surface, the advancing paths of the light rays are shown with fine solid lines and arrows. In the collecting lens 1 of the present embodiment, as shown in FIG. 8, light rays incident on the first surface 10 from a direction that intersects the normal line of the first surface 10 of the collecting lens 1 obliquely (a direction that intersects the direction of lens thickness of the collecting lens 1 obliquely) are focused on a single focal point F (F0) on the second surface 20 side of the collecting lens 1. Light rays incident on the first surface 10 at an incidence angle $\alpha_1$ are refracted at the first surface 10, and a refractive angle $\alpha_2$ can be determined by Snell's law. That is, given $n_1$ as the refractive index of the medium contacted by the first surface 10 and $n_2$ as the refractive index of the lens material, this becomes:

[Math. 4]

$$\frac{\sin\alpha_2}{\sin\alpha_1} = \frac{n_1}{n_2}$$

according to Snell's law. Thus, in one example of the collecting lens 1 of the present embodiment, given $n_1=1$ if the medium is air and $n_2=1.53$ if the lens material is polyethylene, then if $\alpha_1=45°$, $\alpha_2=27.5°$. In the collecting lens 1 of the present embodiment, parallel light that has been refracted at refractive angle $\alpha_2$ at the first surface 10 can be focused on focal point F by configuring each lens function surface 23 from part of the side surface of an elliptical cone 30. This has been confirmed by simulation using a ray-tracing algorithm.

In the collecting lens 1 of the present embodiment, the first surface 10 is a flat surface, and the central axes of the elliptical cones 30 intersect normal lines at each point on the first surface 10 obliquely (in FIG. 8, only one normal line is shown with a dashed-dotted line). In a cross-sectional shape containing one virtual straight line extending in the direction of lens thickness (here, a cross-sectional shape containing a normal line of the first surface 10), the angle formed by each lens surface 21 and a plane parallel to the first surface 10 is an obtuse angle, and the angle formed by each rising surface 22 with a plane parallel to the first surface 10 is a roughly right angle.

Figure 9:
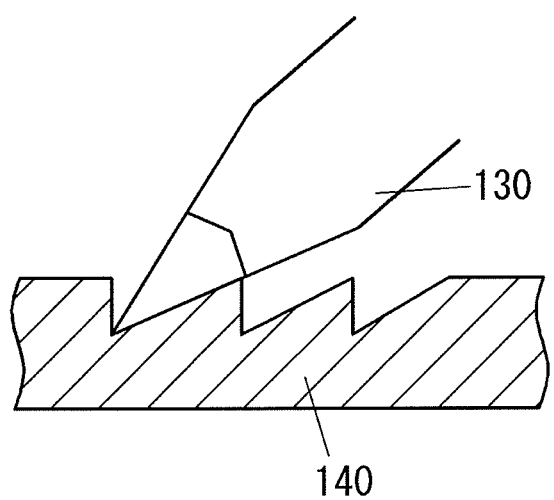
FIG. 9 is an explanatory drawing showing a method of manufacturing the collecting lens of Embodiment 4.

If the cross-sectional shape of each lens surface is a straight line in a cross-section containing a normal line of the flat surface that is the input surface of the Fresnel lens, the machining time can be greatly reduced because the lens surface or a curved surface corresponding to the lens surface can be formed by angling the cutting tool 130 relative to the work piece 140 and bringing the side surface of the blade into line contact to cut the work piece as shown in FIG. 9. In a Fresnel lens in which the shape of each lens surface on the output surface is rotationally symmetrical with a normal line of the input surface as the axis of rotation, it is known that the cross-sectional shape of each lens surface can be made into a straight line if each lens surface is approximated by the side surface of a frustum of a cone (U.S. Pat. No. 4,787,722 (Description)).

The Fresnel lens disclosed in U.S. Pat. No. 4,787,722 (Description) is designed for infrared light rays, and U.S. Pat. No. 4,787,722 (Description) describes using polyethylene as the lens material.

In a Fresnel lens in which the shape of each lens surface on the output surface is rotationally symmetrical with a normal line of the input surface as the axis of rotation, off-axis aberrations occur if each lens surface is approximated by the side surface of a frustum of a cone.

To resolve the issues of controlling off-axis aberrations and reducing costs, the inventors considered that in a basic structure in which a second surface 20 is composed of parts of a plurality of hyperboloid surfaces (each being one sheet of a hyperboloid of two sheets) the main axes of which intersect the normal lines of a first surface 10 obliquely, these parts of the plurality of hyperboloid surfaces could be approximated by straight lines in a cross-sectional shape containing one virtual straight line extending in the direction of lens thickness.

In an orthogonal coordinate system with the center of an arbitrary flat plane as an origin and the x axis and the y axis defined as crossing each other at right angles on this arbitrary flat plane, while the z axis is perpendicular to the arbitrary flat plane, the equation of the cone is represented by the following canonical form with (x, y, z) being the coordinates of arbitrary points on the cone, and b and c being the coefficients.

[Math. 5]

$$\frac{x^2+y^2}{b^2} - \frac{z^2}{c^2} = 0 \ (b, c > 0)$$

In a cone represented by this canonical form, the line of intersection with a surface parallel to the xy flat plane is a circle.

Thus, in a frustum of a cone obtained by cutting this cone on two planes parallel to the xy flat plane, it is not possible to approximate the aforementioned parts of the hyperboloid surfaces in the basic structure discussed above.

Focusing on the fact that in the canonical structure described above, the line of intersection between each hyperboloid surface and a flat plane intersecting the main axis of the hyperboloid surface obliquely is an ellipse, the inventors conceived of constituting each of the plurality of lens function surfaces 23 in a lens surface 21 as part of the side surface of an elliptical cone 30 of which apex P is located on the second surface 20 side of the lens 1 and of which base (not shown) is located on the first surface 10 side, and the central axis of which intersects the direction of lens thickness obliquely.

Each lens function surface 23 is a continuous surface formed by a collection (line group) of straight lines 40 (shown as broken lines in FIG. 6), and the single point at which all the straight lines 40 making up the line group intersect is the apex P of the aforementioned elliptical cone 30. Thus, if the layers $25_1$ and $25_2$ are very thin (see FIG. 7), part of the hyperboloid surface can be approximated by part of the side surface of the elliptical cone 30, and in a cross-sectional shape containing one virtual straight line extending in the direction of lens thickness, this same part of the hyperboloid surface can be approximated by a straight line. In FIG. 6, the apex P of the elliptical cone 30 corresponding to the lens function surface 23 below the virtual face VP in central lens part 1a is called $P_{01}$, while the apex P of the elliptical cone 30 corresponding to the lens function surface 23 above the virtual face VP is called $P_{02}$. Similarly, the apex P of the elliptical cone 30 corresponding to the lens function surface 23 below the virtual face VP in the ring-shaped lens part 1b on the side near the central lens part 1a is called $P_{11}$, and the apex P of the elliptical cone 30 corresponding to the lens function surface 23 above the virtual face VP is called $P_{12}$. Furthermore, the apex P of the elliptical cone 30 corresponding to the lens function surface 23 below the virtual face VP in the ring-shaped lens part 1b on the side farther from the central lens part 1a is called $P_{21}$, and the apex P of the elliptical cone 30 corresponding to the lens function surface 23 above the virtual face VP is called $P_{22}$.

In an orthogonal coordinate system with the center of an arbitrary flat plane as an origin and the x axis and the y axis defined as bisecting each other at right angles on this arbitrary flat plane, while the z axis is perpendicular to the arbitrary flat plane, the equation of the elliptical cone is expressed in the following canonical form with (x, y, z) being the coordinates of arbitrary points on the elliptical cone 30 and a, b and c being the coefficients.

[Math. 6]

$$\frac{x^2}{a^2} + \frac{y^2}{b^2} - \frac{z^2}{c^2} = 0 \quad (a \neq b \text{ and } a, b, c > 0)$$

In the elliptical cone represented by this canonical form, the line of intersection with a plane parallel to the xy flat plane is an ellipse. An elliptical cone 30 that intersects the direction of lens thickness obliquely can be represented by this canonical form by performing an appropriate coordinate conversion on an orthogonal coordinate system with the x axis and the y axis specified within a plane perpendicular to the direction of lens thickness (here, within a plane parallel to the first surface 10) and the z axis specified in the direction of lens thickness as in the orthogonal coordinate system shown in the lower left of FIGS. 6 to 8, to thereby designate a new orthogonal coordinate system.

In the explanations below, different symbols are assigned to the six different elliptical cones 30 in the collecting lens 1 of FIG. 6 for purposes of convenience. The two elliptical cones 30, 30 corresponding to the lens surface 21 of the central lens part 1a are called elliptical cones $30_{01}$, $30_{02}$. The two elliptical cones 30, 30 corresponding to the lens surface 21 of the first ring closest to the innermost lens surface 21 are called elliptical cones $30_{11}$, $30_{12}$, while the two elliptical cones 30, 30 corresponding to the lens surface 21 of the second ring second-closest to the innermost lens surface 21 are called elliptical cones $30_{21}$, $30_{22}$. That is, of the elliptical cones 30 other than the elliptical cone 30 corresponding to the innermost lens surface 21, the elliptical cone 30 closest to the central lens part 1a out of the two elliptical cones 30, 30 corresponding to the lens surface 21 of the nth ring (n≥1) counting from closest to the innermost lens surface 21 is called elliptical cone $30_{n1}$, while the elliptical cone 30 furthest from the central lens part 1a is called elliptical cone $30_{n2}$. In this case, the respective apices P, P, P, P, P and P of the elliptical cones $30_{01}$, $30_{02}$, $30_{11}$, $30_{12}$, $30_{21}$ and $30_{22}$ are called apices $P_{01}$, $P_{02}$, $P_{11}$, $P_{12}$, $P_{21}$ and $P_{22}$, and the respective central axes of the elliptical cones $30_{01}$, $30_{02}$, $30_{11}$, $30_{12}$, $30_{21}$ and $30_{22}$ are called central axes $CA_{01}$, $CA_{02}$, $CA_{11}$, $CA_{12}$, $CA_{21}$ and $CA_{22}$. Thus, the apices of the elliptical cones $30_{n1}$, $30_{n2}$ corresponding to the lens surface 21 of the nth ring are called $P_{n1}$, $P_{n2}$, and the central axes of the elliptical cones $30_{n1}$, $30_{n2}$ are called $CA_{n1}$, $CA_{n2}$. Orthogonal coordinate systems are then defined for elliptical cones $30_{01}$, $30_{02}$, $30_{11}$, $30_{12}$, $30_{21}$ and $30_{22}$ with apices $P_{01}$, $P_{02}$, $P_{11}$, $P_{12}$, $P_{21}$ and $P_{22}$ as the origins and the central axes $CA_{01}$, $CA_{02}$, $CA_{11}$, $CA_{12}$, $CA_{21}$ and $CA_{22}$ as the z axes, and with the x axes extending in the direction of the major axis and the y axes extending in the direction of the minor axis of the ellipse in a cross-section perpendicular to the z axis. The formulas for elliptical cones $30_{01}$, $30_{02}$, $30_{11}$, $30_{12}$, $30_{21}$ and $30_{-22}$ can then be expressed by the equation (canonical form) given above for an elliptical cone in each orthogonal coordinate system.

A lens having six lens function surfaces 23 each formed of part of the side surface of an elliptical cone 30 is given as a collecting lens 1 of one example. In the collecting lens 1 of this example, of the six elliptical cones 30, the two elliptical cones 30, 30 corresponding to the innermost lens surface 21 are called elliptical cones $30_{01}$, $30_{02}$, while the two elliptical cones 30, 30 corresponding to the lens surface 21 of the first ring are called elliptical cones $30_{11}$, $30_{12}$, and the two elliptical cones 30, 30 corresponding to the lens surface 21 of the second ring are called elliptical cones $30_{21}$, $30_{22}$. In the collecting lens 1 of this example, given 1 mm as the maximum difference t of the second surface 20 (in this case, the height of peaks 11b at the point closest to focal point F on ring-shaped lens parts 1b) and polyethylene with a refractive index of 1.53 as the lens material, the coefficients a, b and c in the equation (canonical form) of the aforementioned elliptical cone have the values shown in Table 3. However, the prior conditions for determining the values for the coefficients a, b and c shown in Table 3 are that the incident light rays are focused on the focal point F at an incident angle of 45°, with 10 mm as the distance d from an image plane I parallel to the first surface 10 of the collecting lens 1 to a reference plane (the flat plane containing the valleys of peaks 11b) parallel to the first surface 10. The relative positional relationships of apices $P_{01}$, $P_{02}$, $P_{11}$, $P_{12}$, $P_{21}$ and $P_{22}$ can be expressed for example in terms of the coordinates (X, Y and Z) of apices $P_{01}$, $P_{02}$, $P_{11}$, $P_{12}$, $P_{21}$ and $P_{22}$, using an orthogonal coordinate system having the focal point F of the collecting lens 1 as the origin, with the x axis and the y axis bisecting each other at right angles on the image plane I containing the focal point F, and the Z axis specified in the direction perpendicular to the image plane I. In this example, $P_{01}=(-8.89, 0, 9.00)$, $P_{02}=(-8.12, 0, 8.60)$, $P_{11}=(-7.08, 0, 7.70)$, $P_{12}=(-6.59, 0, 7.44)$, $P_{21}=(-5.86, 0, 6.75)$, $P_{22}=(-5.52, 0, 6.57)$.

TABLE 3

| Lens function surface | Coefficient a | Coefficient b | Coefficient c |
|---|---|---|---|
| Elliptical cone $30_{01}$ | 0.38 | 0.28 | 0.05 |
| Elliptical cone $30_{02}$ | 0.18 | 0.14 | 0.05 |
| Elliptical cone $30_{11}$ | 8.90 | 7.30 | 3.33 |
| Elliptical cone $30_{12}$ | 7.41 | 6.37 | 3.49 |
| Elliptical cone $30_{21}$ | 6.38 | 5.60 | 3.28 |
| Elliptical cone $30_{22}$ | 5.82 | 5.25 | 3.38 |

Moreover, in the collecting lens 1 of this example, angles $\theta_{01}$, $\theta_{02}$, $\theta_{11}$, $\theta_{12}$, $\theta_{21}$ and $\theta_{22}$ have the values shown in Table 4. Angle $\theta_{01}$ here is the angle formed by the central axis $CA_{01}$ of the elliptical cone $30_{01}$ and the particular normal line $H_{01}$ of the first surface 10 at the point where the central axis $CA_{01}$ crosses the first surface 10 with the apex $P_{01}$ as the origin. Angle $\theta_{02}$ is the angle formed by the central axis $CA_{02}$ of the elliptical cone $30_{02}$ and the particular normal line $H_{02}$ of the first surface 10 at the point where the central axis $CA_{02}$ crosses the first surface 10 with the apex $P_{02}$ as the origin. Angle $\theta_{11}$ is the angle formed by the central axis $CA_{11}$ of the elliptical cone $30_{11}$ and the particular normal line $H_{11}$ of the first surface 10 at the point where the central axis $CA_{11}$ crosses the first surface 10 with the apex $P_{11}$ as the origin. Angle $\theta_{12}$ is the angle formed by the central axis $CA_{12}$ of the elliptical cone $30_{12}$ and the particular normal line $H_{12}$ of the first surface 10 at the point where the central axis $CA_{12}$ crosses the first surface 10 with the apex $P_{12}$ as the origin. Moreover, angle $\theta_{21}$ is the angle formed by the central axis $CA_{21}$ of the elliptical cone $30_{21}$ and the particular normal line $H_{21}$ of the first surface 10 at the point where the central axis $CA_{21}$ crosses the first surface 10 with the apex $P_{21}$ as the origin. Finally, angle $\theta_{22}$ is the angle formed by the central axis $CA_{22}$ of the elliptical cone $30_{22}$ and the particular normal line $H_{22}$ of the first surface 10 at the point where the central axis $CA_{22}$ crosses the first surface 10 with the apex $P_{22}$ as the origin.

TABLE 4

| | |
|---|---|
| $\theta_{01}$ | 1.64° |
| $\theta_{02}$ | 7.26° |
| $\theta_{11}$ | 10.23° |
| $\theta_{12}$ | 14.05° |
| $\theta_{21}$ | 15.72° |
| $\theta_{22}$ | 18.20° |

It can be seen from Table 4 that in the collecting lens 1, a particular normal line of the first surface 10 crossing a lens function surface 23 is not parallel to the central axis of the elliptical cone 30 corresponding to the lens function surface 23 crossed by that particular normal line, and that the central axes of the elliptical cones $30_{01}$, $30_{02}$, $30_{11}$, $30_{12}$, $30_{21}$ and $30_{22}$ are not mutually parallel.

It can also be seen from Table 4 that in the collecting lens 1, the angle formed by a particular normal line at each point on the first surface 10 and the central axis of a lens function surface 23 of the second surface 20 crossed by this particular normal line is greater in the ring-shaped lens part 1b located further outside of the lens. In other words, in the collecting lens 1 the angle formed by the central axis and the particular normal line is greater in the elliptical cone 30 corresponding to the lens function surface 23 located further outside of the lens. In this case, however, "located on the outside" indicates the relative positional relationship of lens function surfaces 23 located at roughly the same height from the first surface 10.

In the collecting lens 1 of the present embodiment, the respective shapes of the plurality of lens function surfaces 23 in each lens surface 21 are described with straight lines in a cross section containing one virtual straight line extending in the direction of lens thickness. Thus, with the collecting lens 1 of the present embodiment, the lens surface 21 or a curved surface corresponding to the lens surface 21 can be formed by angling the cutting tool 130 relative to the work piece (a base material for forming Fresnel lens 1 directly or a base material for forming a mold for the collecting lens) 140 as shown in FIG. 9, and bringing the side surface of the blade into line contact to cut the work piece. It is thus possible to reduce the time taken to work the work piece with the cutting tool when manufacturing the collecting lens 1 or the mold for the collecting lens 1. The lens material of the collecting lens 1 can be selected appropriately according to the wavelength of the light rays, and can be selected appropriately from plastics (polyethylene, acrylic resin, etc.), glass, silicon, germanium and the like for example. When the wavelength of the light rays is in the infrared range for example, polyethylene, silicon, germanium or the like may be selected, while when the wavelength of the light rays is in the visible range, acrylic resin, glass or the like may be selected. The material of the mold is not particularly limited, but phosphor bronze or the like may be used for example. When a mold is used to form the collecting lens 1, molding can be accomplished by injection molding, compression molding or the like for example.

In the collecting lens 1 of the present embodiment explained above, the second surface 20 on the opposite side from the first surface 10 has a plurality of (three in the example of FIG. 6) lens surfaces 21. Each of the lens surfaces 21 includes a plurality of lens function surfaces (two in the example of FIG. 6). Each of the lens function surfaces 23 is defined as part of a side surface of corresponding one of elliptical cone 30. In the collecting lens 1 of the present embodiment, out of the normal lines at the respective points on the first surface 10, a particular normal line crossing a lens function surface 23 formed of part of the side surface of an elliptical cone 30 is not parallel to the central axis of the elliptical cone 30 corresponding to the lens function surface 23 crossed by the particular normal line. Moreover, the central axes of the elliptical cones 30 forming the lens function surfaces 23 are not mutually parallel. It is thus possible to suppress the occurrence of off-axis aberrations when using incident light falling obliquely on the first surface 10 from the outside, and to reduce costs in the collecting lens 1. In this collecting lens 1, the angle formed by the central axis and the particular normal line is preferably greater in the elliptical cone 30 corresponding to the lens function surface 23 located further outside of the lens. It is thus possible to suppress the occurrence of off-axis aberrations and reduce costs in the collecting lens 1.

To explain further, in the collecting lens 1 of the present embodiment each lens surface 21 is divided into lens function surfaces 23 bounded by virtual faces VP, which cross the direction of lens thickness, and forming different angles with virtual faces VP. In the collecting lens 1 of the present embodiment, moreover, each lens function surface 23 is formed of part of the side surface of an elliptical cone 30 that has its apex P located on the second surface 20 side of the lens and its base located on the first surface 10 side, and the central axis of which intersects the direction of lens thickness obliquely. Thus, the optical axis intersects the direction of lens thickness obliquely in the collecting lens 1 of the present embodiment. Moreover, with the collecting lens 1 of the present embodiment it is possible to suppress the occurrence of off-axis aberrations, and reduce costs.

Moreover, each virtual face VP is specified as crossing the direction of lens thickness in the collecting lens 1 of the present embodiment, making it easier to design each lens function surfaces 23, and easier to adjust the height of the cutting tool 130 when cutting the lens as discussed above. Moreover, when testing the precision of lens shape in the collecting lens 1 of the present embodiment, testing can be accomplished easily by measuring the angle of each lens function surface 23, contributing to lower manufacturing costs.

Embodiment 5

Figure 10A:
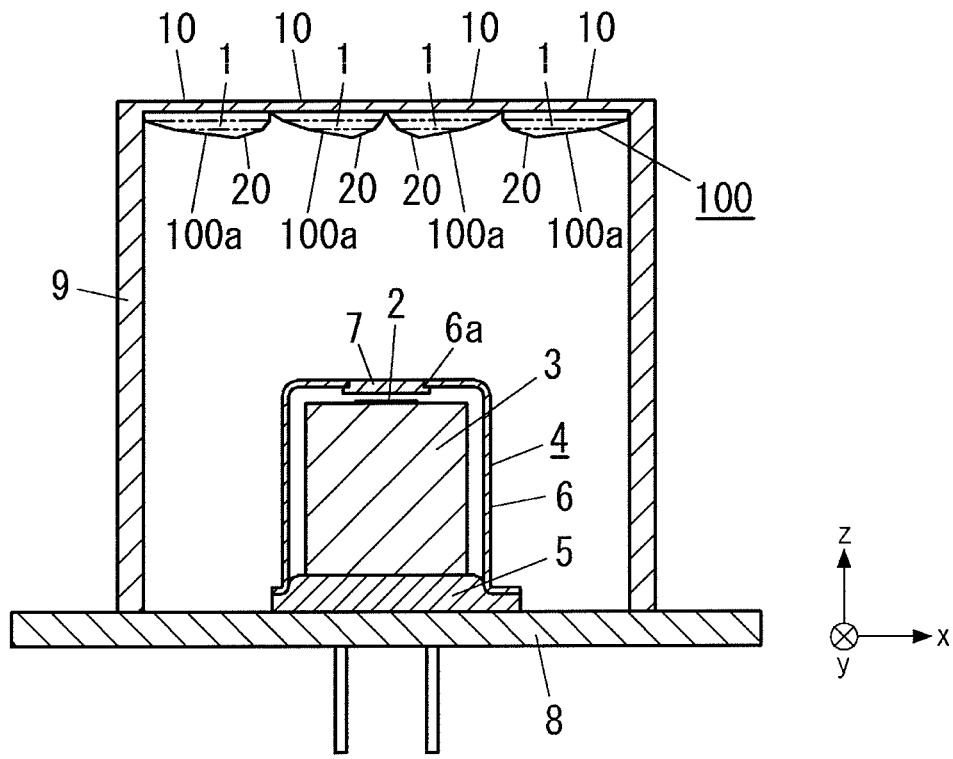
FIG. 10A is a rough cross-section illustrating an applied example of the multi-segment lens of Embodiment 5.
Figure 10B:
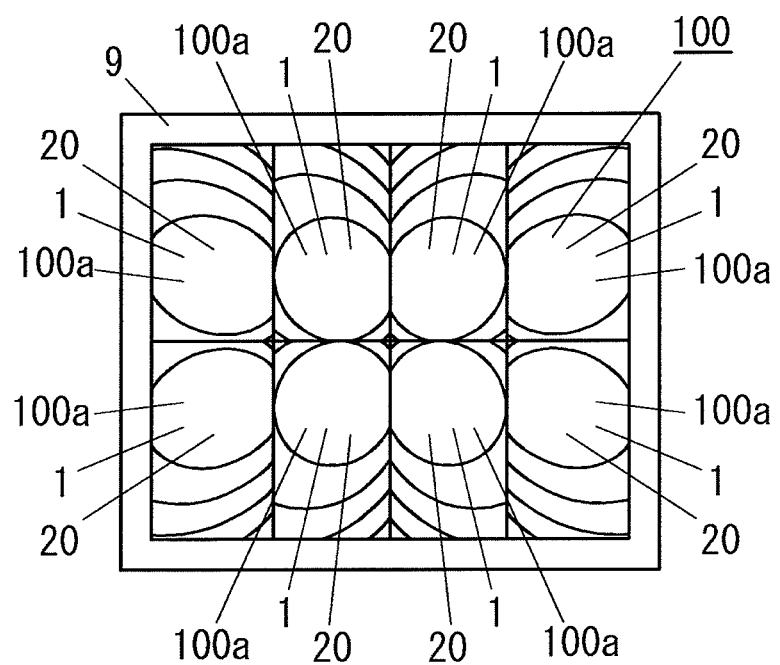
FIG. 10B is a rough bottom view of the essential parts of an applied example of the multi-segment lens of Embodiment 5.

In the present embodiment, a sensor apparatus of the configuration shown in FIGS. 10A and 10B is explained as an applied example of a multi-segment lens.

This sensor apparatus includes package 4 mounted on a circuit board 8, which is a printed wiring board. This package 4 is made up of a disk-shaped stem 5, a bottomed cylindrical cap 6, which is bonded to this stem 5, and a light-transmitting member 7, which is disposed so as to block an aperture 6a formed at the bottom of the cap 6, and functions to transmit the desired light rays. The package 4 also contains an element-holding member (a MID substrate or the like for example) 3 for holding a photoelectric conversion element 2. In the sensor apparatus, a cover member 9 having a multi-segment lens 100 is disposed on one surface of the circuit board 8 so as to cover package 4. A pyroelectric element or other infrared sensor element or a photodiode or other light-receiving element or the like for example can be used as the photoelectric conversion element 2 here. When an infrared sensor element is used as the photoelectric conversion element 2, a silicon substrate, germanium substrate or the like is preferably used as the light-transmitting member 7. In this case, moreover, both the stem 5 and the cap 6 of the package 4 are preferably formed of a metal material, and the light-transmitting member 7 and the cap 6 are preferably bonded by an electrically conductive material. In this case, the air layer in the space between the cover member 9 and the package 4 functions as a heat insulating layer.

The multi-segment lens 100 includes a plurality of lenses 100a assembled on a single surface (a single flat surface in the example shown), and each lens 100a is composed of the collecting lens 1 explained in Embodiment 4. However, adjacent collecting lenses 1 are arranged so as to overlap one another, with part of ring-shaped lens 1b cut away. Moreover, each collecting lens 1 is designed so that the optical axis (not shown) passes through a specific light-receiving surface of the photoelectric conversion element 2.

Thus, with the multi-segment lens 100 of the present embodiment it is possible to control the occurrence of off-axis aberrations, and also reduce costs. With the sensor apparatus of the present embodiment, moreover, it is possible to achieve an infrared sensor with a wide detection area of the sensor apparatus when using an infrared sensor element for example as the photoelectric conversion element 2.

A quad-type pyroelectric element including four elements (light-receiving parts) formed on a single pyroelectric substrate for example can be used as the pyroelectric infrared detecting element making up the aforementioned infrared sensor element. The detection area of the sensor apparatus is determined by the infrared sensor element and by the multi-segment lens 100. Thus, detection beams in the same number as the number of elements are set for each collecting lens 1 in the detection area of the sensor apparatus. A detection beam (also called a detection zone) is a small range near the peak of the amount of infrared rays incident on the infrared sensor element, which is the effective area for detecting infrared rays from a physical object of detection. In the sensor apparatus shown in FIGS. 10A and 10B, because multi-segment lens 1 is composed of eight collecting lenses 1, 8×4 detection beams are set within the detection area. The number of collecting lenses 1 in the multi-segment lens is not particularly limited, however.

Embodiment 6

The collecting lens 1 of the present embodiment is explained below with reference to FIG. 11.

The basic configuration of the collecting lens 1 of the present embodiment is similar to that of Embodiment 4, except that of the plurality of lens surfaces 21, the innermost lens surface 21 is configured from a central lens surface 21a defined as part of an aspheric surface. Curvature of the aspheric surface is changes continuously. The aspheric surface is a hyperboloid surface 25. The rotational axis of the hyperboloid surface 25 intersects the direction of lens thickness obliquely. Constituent elements that are the same as in Embodiment 4 are described with the same symbols, and explanations thereof are omitted.

All of the plurality of lens surfaces 21 can be configured from parts of elliptical cones 30 as in the collecting lens 1 of Embodiment 4. However, when all of the plurality of lens surfaces 21 are configured from parts of elliptical cones 30, the innermost lens surface 21 of the central lens part 1a contains apex P of elliptical cone 30, making the curvature discontinuous at this apex P, and thereby making it difficult for light rays passing through this apex P to focus on focus point F.

By contrast, in the collecting lens 1 of the present embodiment the central lens surface 21a which is located inward from the plurality of lens surface 21, or in other words the central lens surface 21a which is the lens surface of the central lens part 1a, is made part of the aforementioned hyperboloid surface 25.

Thus, in the collecting lens 1 of the present embodiment it is possible to reduce aberrations in comparison with the collecting lens 1 of Embodiment 4, and to improve the light-collecting performance of the lens. Sensitivity can therefore be increased by applying the collecting lens 1 of the present embodiment to the sensor apparatus explained in Embodiment 5.

Figure 12A:
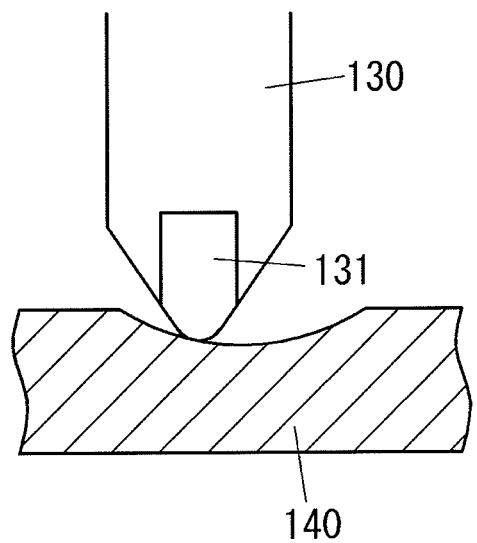
FIGS. 12A and 12B are explanatory drawings showing a method of manufacturing the collecting lens of Embodiment 6.
Figure 12B:
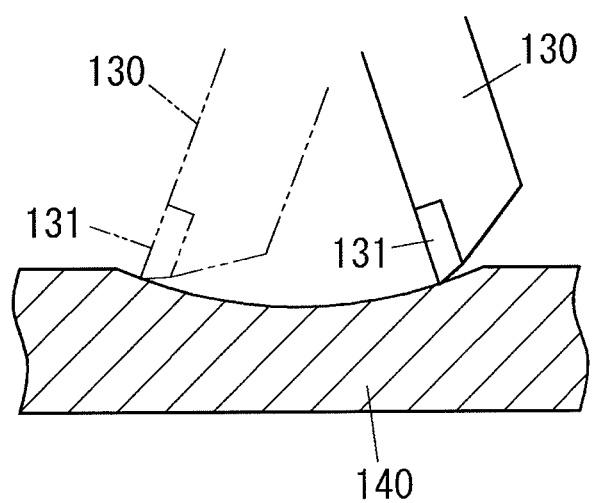

In the collecting lens 1 of the present embodiment, aberrations can be reduced more by configuring the central lens surface 21a of the central lens part 1a as part of a hyperboloid surface 25 than by configuring it as part of an aspheric surface other than a hyperboloid surface 25. When manufacturing the mold for the collecting lens 1, if the central lens surface 21a of the central lens part 1a is part of a hyperboloid surface 25, the process can be performed by moving the scoop surface 131 of the cutting tool 130 at an angle to make it perpendicular to the curvature in accordance with the curved surface 21 as shown in FIG. 12. In this case, because the process is possible as long as the nose radius of the cutting tool 130 is smaller than the curvature radius of the hyperboloid surface 25, the working time can be reduced even if the central lens surface 21a of the central lens part 1a is part of a hyperboloid surface 25.

In the collecting lens 1 of the present embodiment, the light-collecting performance can be improved in comparison with the collecting lens 1 of Embodiment 4 not only when central lens surface 21a of the central lens part 1a is a hyperboloid surface 25, but also when it is an aspheric surface which has a symmetric axis intersecting the direction of lens thickness obliquely and has curvature changing continuously. That is, in the collecting lens 1, the central lens surface 21*a* located inwards from the plurality of lens surfaces 21 is preferably defined as part of an aspheric surface of which curvature changes continuously. A specific normal line is arbitrarily selected from the normal lines at the respective points on the first surface 10. The specific normal line crosses the central surface 21*a* corresponding to the aspheric surface is preferably not parallel to (oblique to) the axis of symmetry of the aspheric surface (the rotational axis (OP1) of the hyperboloid surface 25 when the aspheric surface is hyperboloid surface 25) corresponding to the central lens surface 21*a* crossed by that specific normal line, thereby contributing to improved light-collecting performance. In this case, in the collecting lens 1 the axis of symmetry for this aspheric surface may also be non-parallel to the normal lines at each point in the projection domain of the first surface 10 when the central lens surface 21*a* is projected in a direction parallel to the central axis of the first surface 10.

Conventionally, aplanatic lenses are known as lenses without aberrations (see for example Hiroshi Kubota, "Kougaku", Vol. 12, Iwanami Shoten Pub., Apr. 9, 1986, pp. 282-283).

Figure 13:
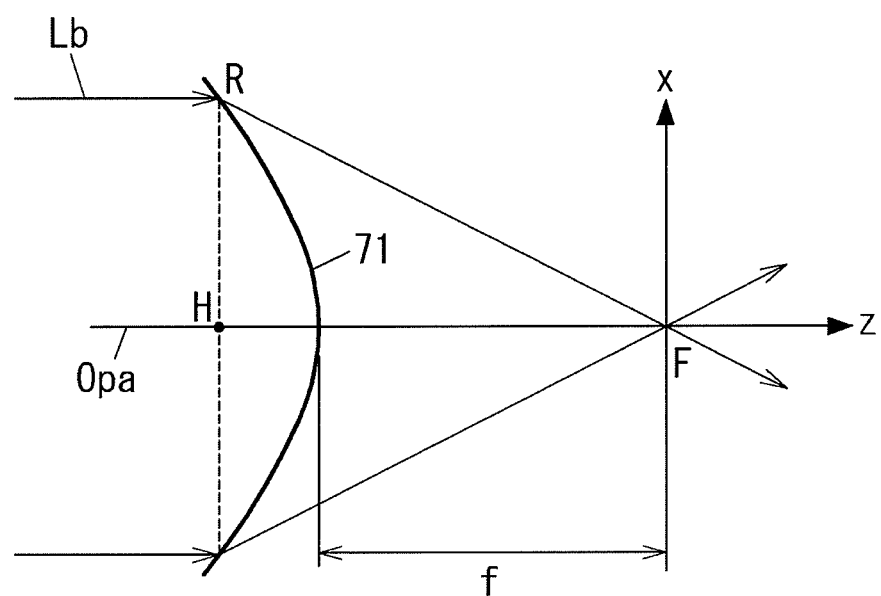
FIG. 13 is an explanatory drawing illustrating the principles of a conventional aberration-free lens.

As shown in FIG. 13, in a lens having a lens surface 71, RF=HF must be satisfied in order for a light beam Lb parallel to the optical axis Opa of the lens to be focused on focal point F with a constant optical path length. R here is the refraction point of the lens surface 71, while H is the point of intersection on the optical axis Opa of a vertical line drawn from the refraction point R (end of a vertical line drawn from the refraction point R to the optical axis Opa), RF is the optical path length between the refraction point R and the focal point F, and HF is the optical path length between the intersection point H and the focal point F. It is known that to satisfy the condition of RF=HF, lens surface 71 must be a hyperboloid surface or an elliptical surface. When lens surface 71 is a hyperboloid surface, lens surface 71 is given by the following formula (1) given n as the refractive index of the lens material and f as the back focus of the lens.

[Math. 7]

$$\frac{(z-c)^2}{a^2} - \frac{x^2+y^2}{b^2} = 1 \quad (1)$$

However, this formula is obtained when the coordinates of any points on the lens surface 71 are (x, y, z) in an orthogonal coordinate system with focal point F of the lens as the origin, with the z axis on the optical axis Opa, and with the x axis and the y axis perpendicular to one another in a plane perpendicular to the optical axis Opa. Moreover, a, b and c in formula (1) are given by formulae (2), (3) and (4), respectively.

[Math. 8]

$$a = \frac{f}{n+1} \quad (2)$$

$$b = \sqrt{\frac{n-1}{n+1}} f \quad (3)$$

$$c = \frac{n}{n+1} f \quad (4)$$

Figure 11:
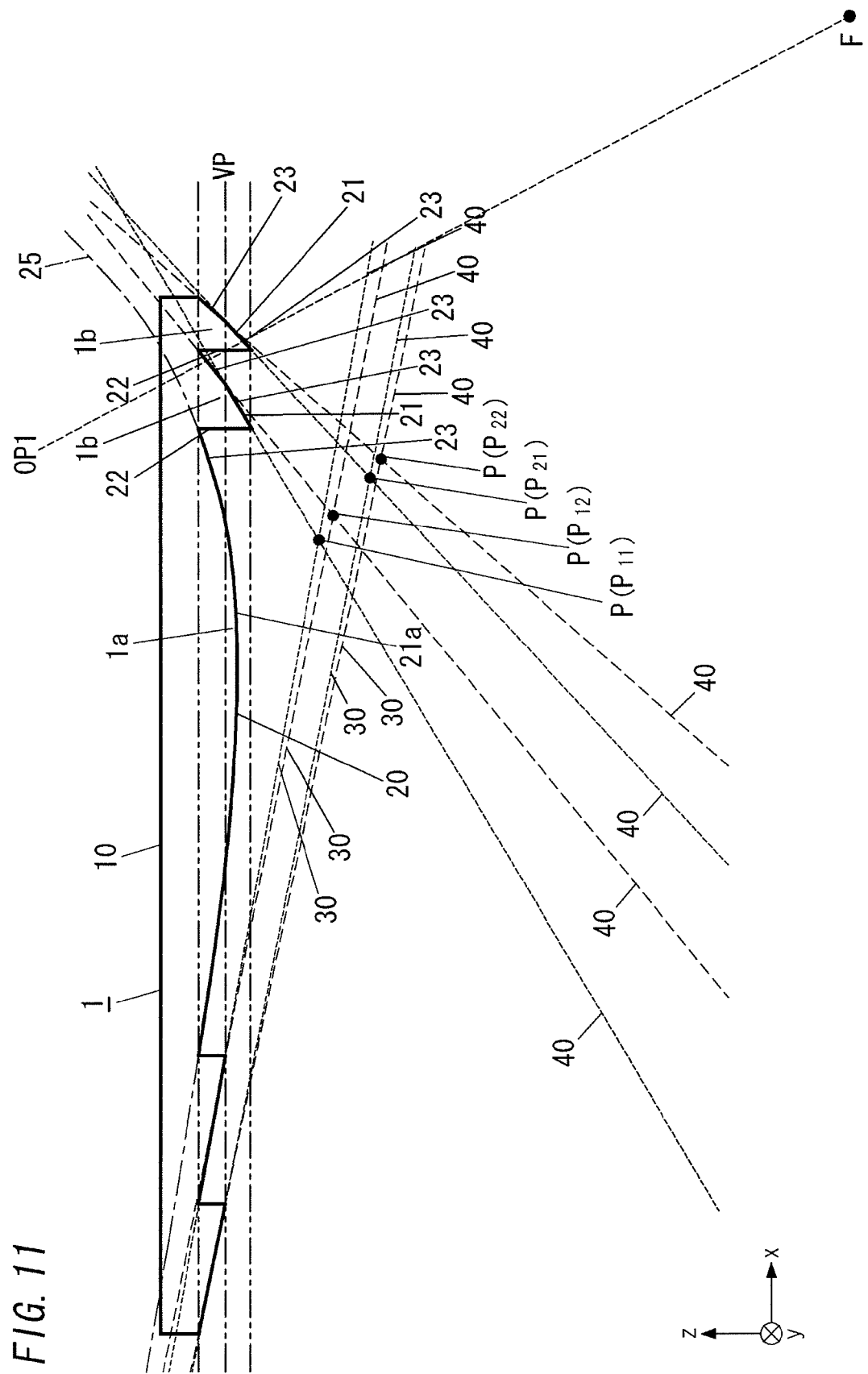
FIG. 11 is an explanatory drawing showing the geometric shape of the collecting lens of Embodiment 6.

In the collecting lens 1 of FIG. 11, the hyperboloid surface 25 that forms the central lens surface 21*a* of the central lens part 1*a* is represented by formula (1) above in an orthogonal coordinate system with focal point F as the origin, the rotational axis OP1 of the hyperboloid surface 25 as the z axis, and the x axis and the y axis perpendicular to the z axis.

When light rays hitting the first surface 10 at an incident angle of 45° are focused on the focal point F, the angle formed by the rotational axis OP1 of the hyperboloid surface 25 of the central lens part 1*a* with a normal line of the first surface 10 can be given as 27.5° according to Snell's law. That is, the rotational axis OP1 can be tilted just 27.5° relative to the normal line of the first surface 10.

Embodiment 7

The collecting lens 1 of the present embodiment is explained below with reference to FIG. 14.

The basic configuration of the collecting lens 1 of this Embodiment is roughly the same as in Embodiment 4. The collecting lens 1 of the present embodiment differs from that of Embodiment 4 in the shape of the first surface 10. Constituent elements that are the same as in Embodiment 4 are described with the same symbols, and explanations thereof are omitted.

In the collecting lenses 1 of Embodiments 4 to 6, using polyethylene as the lens material, even with a lens thickness of 1 mm the transmittance of infrared rays near a wavelength of 10 microns normally incident on the first surface 10 is 40%, and the transmittance declines as the lens thickness increases. In the case of incident light from a direction not perpendicular to the first surface 10 of the collecting lens 1, the transmittance may be reduced excessively because the optical path becomes even longer than the maximum lens thickness of the collecting lens 1. In a collecting lens 1 formed of polyethylene, moreover, if there are large changes in lens thickness there is a risk of sink marks due to uneven shrinkage and the like during the cooling and solidification processes of injection molding, potentially detracting from external appearance.

Thus, a lens is manufactured by injection molding. The first surface 10 of the collecting lens 1 made of polyethylene is preferably made as a curved surface that is convex in the opposite direction from the second surface 20 as shown in FIG. 14 for example. In this case, the direction of lens thickness is the normal direction at each point on the first surface 10. With the collecting lens 1 of the present embodiment, it is possible to restrict the direction of swelling to one direction and prevent problems of external appearance by making the first surface 10 be a curved surface that is convex in the opposite direction from the second surface 20.

Figure 14:
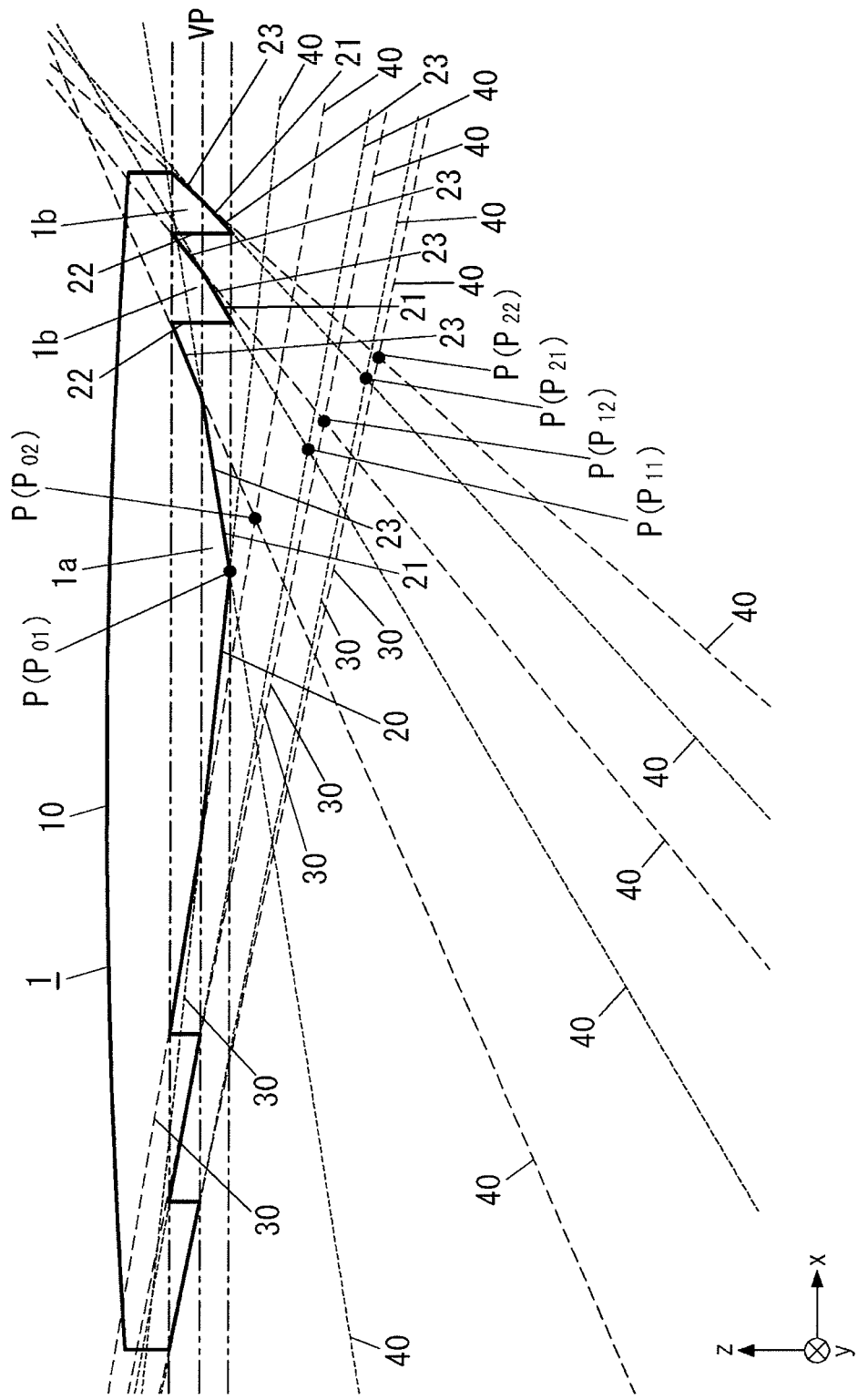
FIG. 14 is an explanatory drawing showing the geometric shape of the collecting lens of Embodiment 7.
Figure 15:
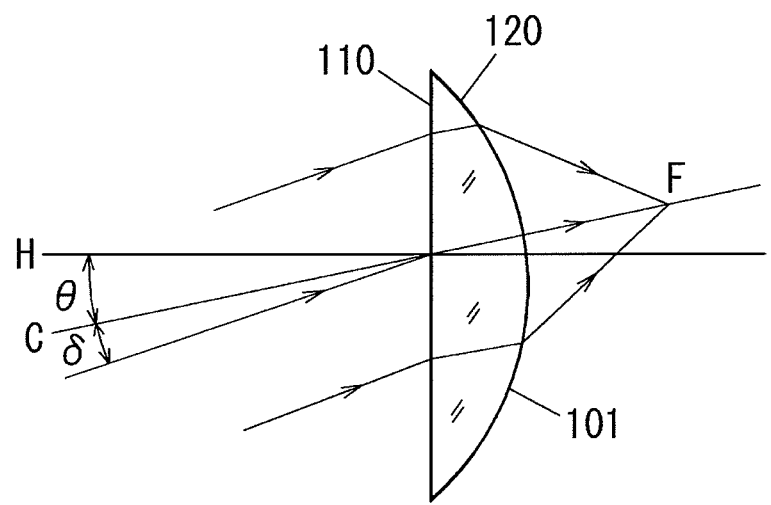
FIG. 15 is a cross-section of a collecting lens of a conventional example.
Figure 16A:
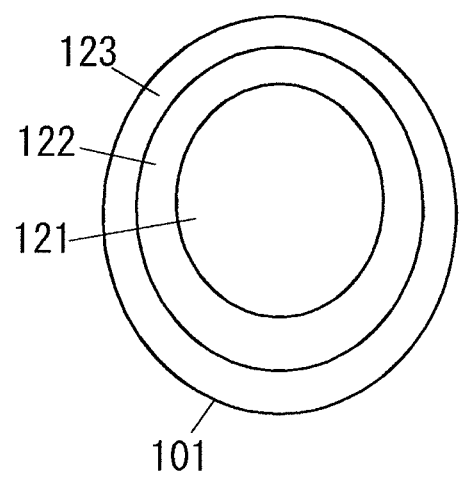
FIG. 16A is a plane view of a Fresnel lens of a conventional example.
Figure 16B:
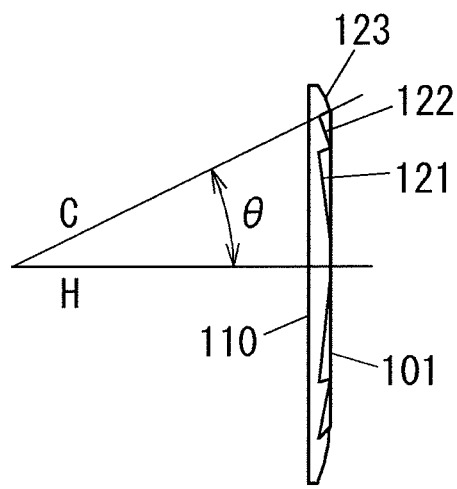
FIG. 16B is a cross-section of a Fresnel lens of a conventional example.
Figure 17A:
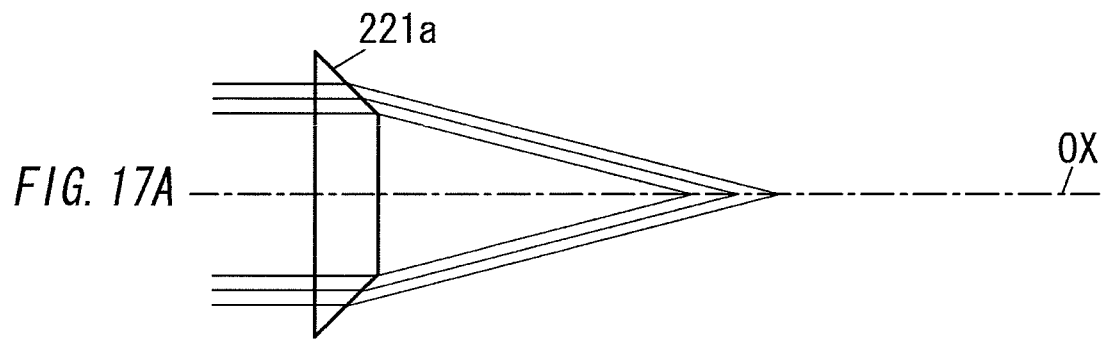
FIGS. 17A through 17E are outline drawings for explaining an axicon lens.
Figure 17B:
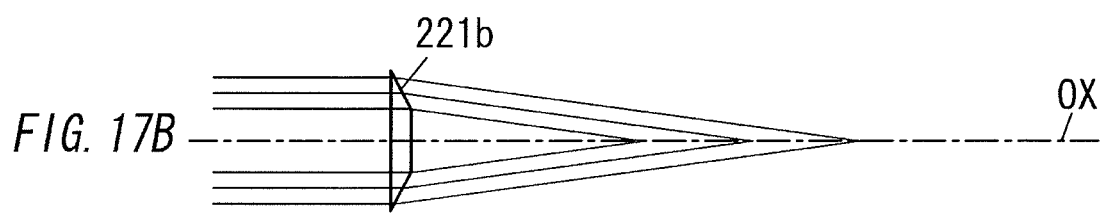
Figure 17C:
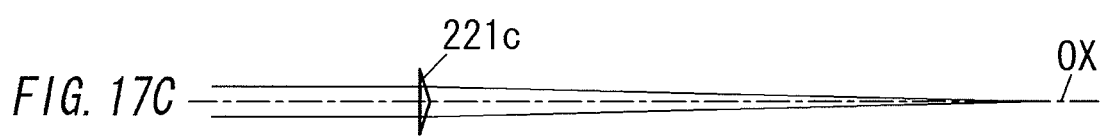
Figure 17D:
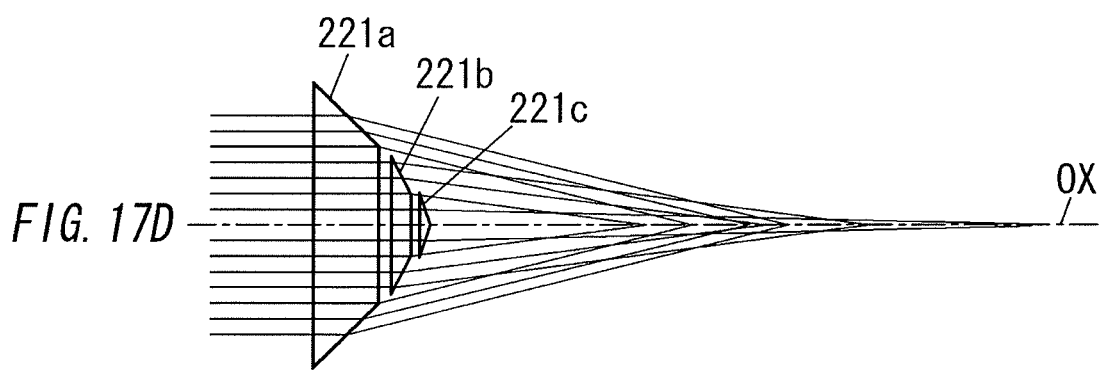
Figure 17E:
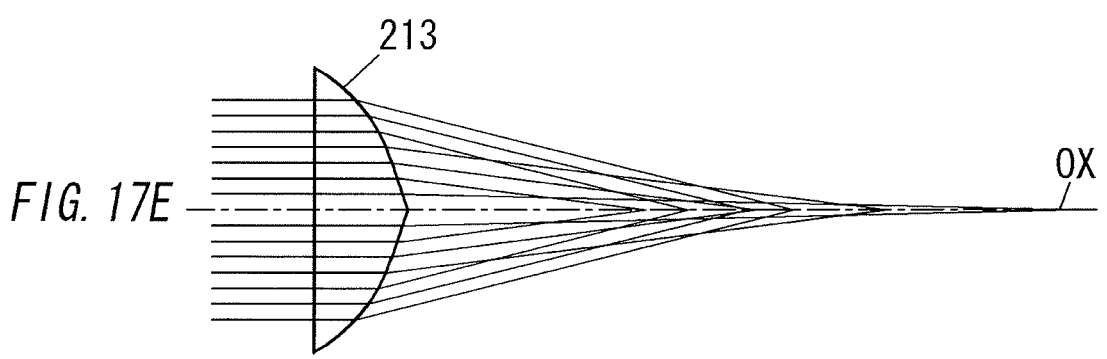
Figure 18:
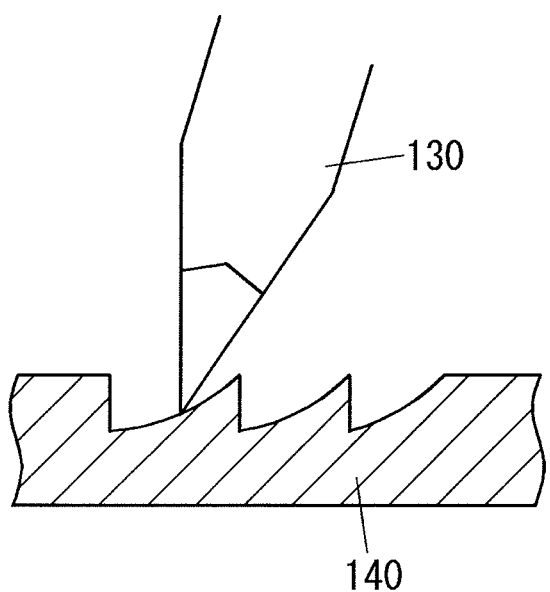
FIG. 18 is an explanatory drawing of a method of manufacturing a Fresnel lens of a conventional example.

In the example shown in FIG. 14, the first surface 10 is formed of part of a sphere with a large curvature radius (a curved surface with a small curvature), but it need not be part of a sphere. A "large curvature radius" here means a curvature radius that is large enough for the first surface 10 to appear as a flat surface, but the curvature radius of the first surface 10 may be designed appropriately based on the lens radius of the collecting lens 1 and the like.

That is, if the curvature of the first surface 10 is designed within a range at which off-axis aberrations do not exceed an allowable value (for example, no more than the size of photoelectric conversion element 2 above) in the collecting lens 1 made of polyethylene, it is possible to both suppress off-axial aberrations and control the occurrence of sink marks and swelling even while reducing the lens thickness. In this Description, forms including first surfaces 10 having such a curvature and first surfaces 10 having a flat surface are called flat first surfaces 10. Even a first surface 10 in a collecting lens 1 explained with reference to FIGS. 10A and 10B and FIG. 11 preferably has a curved surface that is convex in the opposite direction from the second surface 20.

The invention claimed is:

1. A collecting lens comprising:
   a first surface; and
   a second surface;
   wherein said first surface is defined as an opposite surface of said collecting lens from said second surface, and
   said second surface has a lens surface, and
   said lens surface includes a plurality of lens function surfaces, and
   each of said lens function surfaces is defined as part of a side surface of corresponding one of elliptical cones, and
   a particular normal line which is arbitrarily selected from normal lines at respective points on said first surface and crosses one of said lens function surfaces is not parallel to a central axis of the elliptical cone corresponding to said lens function surface crossed by said particular normal line, and
   said central axes of the elliptical cones are not parallel to each other.

2. A collecting lens according to claim 1,
   wherein an angle formed by said central axis and said particular normal line is greater in the elliptical cone corresponding to said lens function surface located further outside of said collecting lens.

3. A collecting lens according to claim 1, defined as a Fresnel lens having a plurality of said lens surfaces.

4. A collecting lens according to claim 1,
   wherein said collecting lens is made of polyethylene, and
   said first surface is a curved surface that is convex in the opposite direction from said second surface.

5. A multi-segment lens comprising a plurality of lenses assembled on a single surface,
   wherein each of said lenses is said collecting lens according to claim 1.

6. A collecting lens according to claim 1, comprising
   a plurality of said lens surfaces, and
   a central lens surface located inward from the plurality of said lens surfaces,
   wherein said central lens surface is defined as part of an aspheric surface of which curvature changes continuously, and
   a specific normal line which is selected arbitrarily from the normal lines at the respective points on said first surface and crosses said central lens surface corresponding to the aspheric surface is not parallel to an axis of symmetry of the aspheric surface.

7. A collecting lens according to claim 6,
   wherein the aspheric surface is a hyperboloid surface.

* * * * *